(12) United States Patent
Sakamoto et al.

(10) Patent No.: US 7,750,332 B2
(45) Date of Patent: Jul. 6, 2010

(54) SOLID ELECTROLYTE SWITCHING DEVICE, FPGA USING SAME, MEMORY DEVICE, AND METHOD FOR MANUFACTURING SOLID ELECTROLYTE SWITCHING DEVICE

(75) Inventors: Toshitsugu Sakamoto, Tokyo (JP); Masakazu Aono, Saitama (JP); Tsuyoshi Hasegawa, Saitama (JP); Tomonobu Nakayama, Saitama (JP); Hiroshi Sunamura, Tokyo (JP); Hisao Kawaura, Tokyo (JP); Naohiko Sugibayashi, Tokyo (JP)

(73) Assignees: Japan Science and Technology Agency, Kawaguchi-shi (JP); Riken, Wako-shi (JP); NEC Corporation, Tokyo (JP)

( * ) Notice: Subject to any disclaimer, the term of this patent is extended or adjusted under 35 U.S.C. 154(b) by 124 days.

(21) Appl. No.: 10/512,571

(22) PCT Filed: Apr. 25, 2003

(86) PCT No.: PCT/JP03/05393
§ 371 (c)(1),
(2), (4) Date: Oct. 26, 2004

(87) PCT Pub. No.: WO03/094227
PCT Pub. Date: Nov. 13, 2003

(65) Prior Publication Data
US 2005/0127524 A1 Jun. 16, 2005

(30) Foreign Application Priority Data
Apr. 30, 2002 (JP) ............................. 2002-129283
Nov. 28, 2002 (JP) ............................. 2002-346129

(51) Int. Cl.
*H01L 47/00* (2006.01)

(52) U.S. Cl. ........... 257/2; 257/4; 257/43; 257/E29.002
(58) Field of Classification Search ............... 257/2, 257/4
See application file for complete search history.

(56) References Cited

U.S. PATENT DOCUMENTS

| 5,550,400 A * | 8/1996 | Takagi et al. ............... 257/530 |
| 6,348,365 B1 * | 2/2002 | Moore et al. ............... 438/130 |
| 6,737,312 B2 * | 5/2004 | Moore ....................... 438/238 |
| 2002/0168820 A1 * | 11/2002 | Kozicki et al. ............ 438/259 |

FOREIGN PATENT DOCUMENTS

| JP | 2-60166 | 2/1990 |
| JP | 4-255674 | 9/1992 |
| JP | 6-28841 | 2/1994 |
| JP | 6-28841 A | 2/1994 |
| JP | 9-36355 | 2/1997 |
| JP | 2001-237380 A | 8/2001 |
| JP | 2001-525606 A | 12/2001 |
| JP | 2002-76325 | 3/2002 |
| WO | WO 99/28914 | 6/1999 |

OTHER PUBLICATIONS

Hironosuke Ikeda et al.; Electrochemistry, vol. 44, No. 8, pp. 535-539, 1976. Cited in the PCT search report.

* cited by examiner

*Primary Examiner*—Jerome Jackson, Jr.
(74) *Attorney, Agent, or Firm*—Westerman, Hattori, Daniels & Adrian, LLP

(57) ABSTRACT

The present invention provides a solid electrolyte switching device, which can maintain an on or off state when the power source is removed, the resistance of which in on the state is low, and which is capable of integration and re-programming, and FPGA and a memory device using the same, and a method of manufacturing the same.

A solid electrolyte switching device (10, 10', 20, 20') comprises a substrate (11) in which surface is coated with an insulation layer, a first interconnection layer (13) set on said substrate (11), an ion supplying layer (17) set on said first interconnection layer (13), a solid electrolyte layer (16) set on said ion supplying layer (17), an interlevel insulating layer (12) having a via hole set to cover said first interconnection layer (13), said ion supplying layer (17), and said solid electrolyte layer (16), a counter electrode layer (15) set to contact said solid electrolyte layer (16) through the via hole of said interlevel insulating layer (12), and a second interconnection layer (14) set to cover said counter electrode layer (15). The switching device can be provided in which the on state, or the off state can be arbitrarily set by the threshold voltage applied between the ion supplying layer (17) and the counter electrode layer (15), which is non-volatile, and the resistance of which in the on state is low. The switching device of the present invention is also simple and fine in structure, and hence makes it possible to provide smaller switching devices than are currently available. Further, using the switching device of the present invention as the switching device of an FPGA (30) makes it possible to provide re-programmable and fast operation FPGA (30). Using the switching device of the present invention as a memory cell of a memory device makes it possible to provide a non-volatile memory device with high programming and reading speed.

17 Claims, 16 Drawing Sheets

F I G. 5
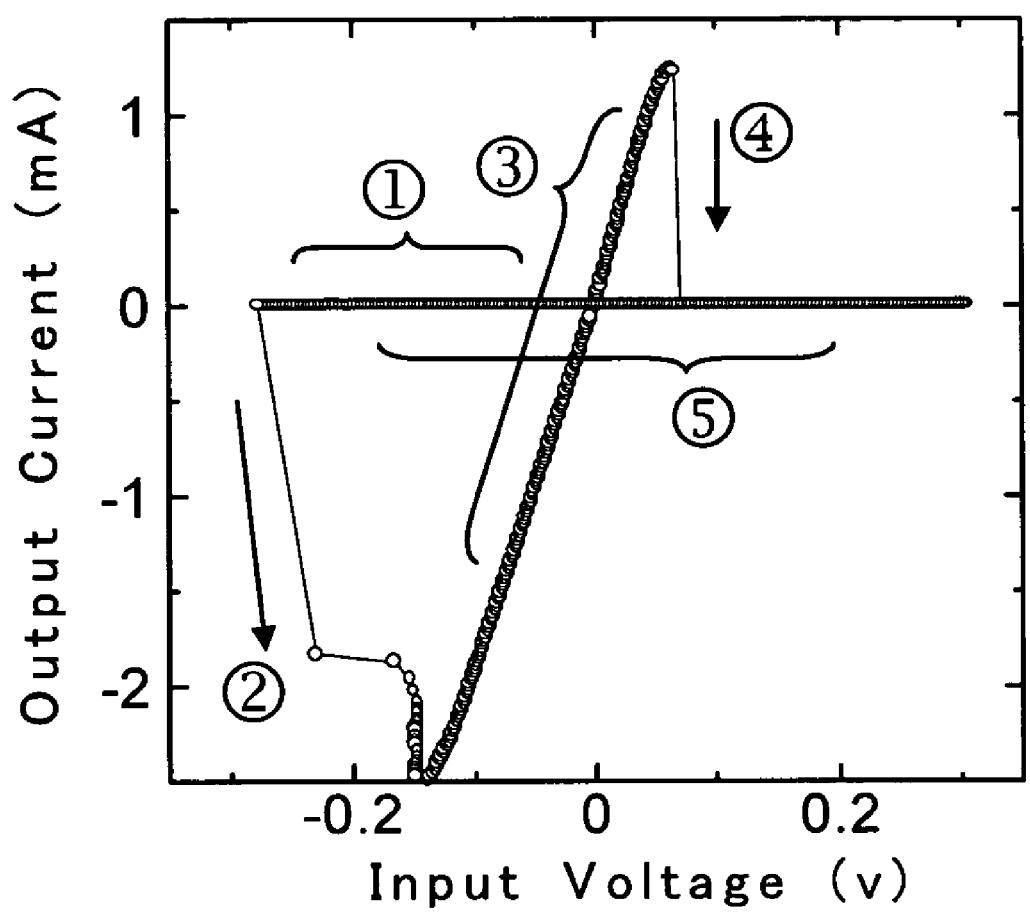

(a)

(b)

(a)  (b)

(a)

(b)

(c)

(d)

(a)

(b)

(c)

(d)

SOLID ELECTROLYTE SWITCHING
DEVICE, FPGA USING SAME, MEMORY
DEVICE, AND METHOD FOR
MANUFACTURING SOLID ELECTROLYTE
SWITCHING DEVICE

TECHNICAL FIELD

The present invention relates to a solid electrolyte switching device, FPGA and memory devices using the same, and a method of manufacturing the same.

BACKGROUND ART

As a switching device with the ability of maintaining the state of on or off when the power source is switched off (non-volatility), prior to this invention exists firstly an anti-fuse device, secondly EEPROM (Electrically Erazable and Programmable Read Only Memory), thirdly an electron device which can control the conductance by utilizing a mixed conductor, which is a sort of solid electrolyte, fourthly a PMC (Programmable Metallization Cell), fifthly a PCRAM (Programmable Conductor Random Access Memory), and sixthly a PCM (Phase Change Memory).

The antifuse device as the first prior art is a switching device that has two electrical states, on and off, and can irreversibly transit from off to on state by using either an electrical or physical method. The antifuse device is usually composed between two interconnection layers, and is electrically connected these two layers. It is programmed (transition from off to on state) by biasing a high voltage selectively between these interconnection layers. This on state is maintained after the voltage source is disconnected (see U.S. Pat. Nos. 5,070,384, 5,171,715, 5,387,812, and 5,543,656, and Japanese publication No. JP 08-78532A).

The EEPROM as the second prior art consists of a floating gate electrode that is sandwiched between the control gate electrode of a transistor and its channel layer. The transistor is turned on or off by being charged or discharged electrically via the floating gate electrode. This charge or discharge is conducted by a tunneling current through an oxide film where electrons are injecting into or discharging from the floating gate electrode. Since the floating gate electrode is surrounded by insulating film, the stored charge is not lost after the power source is switched off and the non-volatility is attained (see U.S. Pat. Nos. 4,203,158, and 4,366,555).

The antifuse device and EEPROM are now used for FPGA (Field Programmable Gate Array). The FPGA is a device in which hardware configuration can be changed for each application. A user can wire logic circuit blocks by switching devices, and various hardware configurations can be attained by different wiring positions. This FPGA has, compared with ASIC (Application Specified Integrated Circuit), various merits such as being general commodity and hence can be manufactured with low cost and short TAT (Turn Around Time), and hence its market scale is rapidly expanding.

The electron device as the third prior art is a switching device utilizing silver sulfide that is a silver ion conductive solid electrolyte (see Japanese publication No. JP 2002-76325A).

The solid electrolyte is a material in which ions can move around freely in a solid. So far many materials showing cations and anions conductivity have been found. In case that the solid electrolyte contains a metal, metal ions move in a solid and transport an electric current when an electric field is applied. Furthermore, a mixed conductor that is a sort of a solid electrolyte is capable of the electron conduction in addition to the ionic conduction.

FIG. 18 shows the structure of an electron device disclosed in Japanese publication No. JP 2002-76325A. As shown in the figure, silver sulfide 61 is formed on a semiconductor substrate 63 by sulphidizing the surface of silver wire, and it is set close to platinum wire 62 as a counter electrode. Since the gap between silver sulfide 61 and the platinum wire 62 is small, when a positive voltage on silver sulfide 61 and a negative voltage on platinum wire 62 are applied by a power source 67, silver ions 64 in silver sulfide 61 are deposited on the surface as silver atom, a silver bridge 65 is formed over the gap to platinum, and a point contact is formed. In this case, current between silver sulfide 61 and platinum wire 62 does not flow while the bridge 65 is not formed, but begins to flow when the bridge 65 is formed. Formation and disappearance of the bridge 65, that is, on and off occur at about 0.2V and at high speed, shorter than microsecond.

The electron device PMC as the fourth prior art, for example, a two terminal switch device using chalcogenide (see U.S. Pat. No. 5,761,115 (FIG. 1 and FIG. 4B)).

FIG. 19 is a cross-sectional view showing the structure of the electron device as the fourth prior art mentioned above. The PMC 70 device comprises an ion conductive layer 72 on a substrate 71 between a cathode 73 and an anode 74. When a voltage is applied between the cathode 73 and the anode 74, a dendrite 75 grows along the outer side surface of the ion conductive layer 72 from the cathode 73 toward the anode 74, which forms a current path resulting in switching action. The figure shows dendrite 75 growing along the surface of ion conductive layer 72. The ion conductive layer 72 consists of $As_2S_3$—Ag (arsenic trisulfide-silver) that is a solid electrolyte material like the silver sulfide mentioned above. The resistance change of this electron device is, for example, 2.65 MΩ in the off state and 2.1 MΩ in the on state.

The PCRAM as the fifth prior art is a two terminal switching device utilizing silver germanium-selenide that is a silver ion conductive solid electrolyte (see U.S. Pat. No. 6,348,365B1 (FIG. 6)).

FIG. 20 is a cross-sectional view showing the structure of PCRAM as the fifth prior art mentioned above. PCRAM 80 comprises an insulation material 81, a conductive material 82, and a dielectric material 83 on a semiconductor substrate 87, with a recess structure (groove structure) in part of the dielectric material 83. In the recess structure an ion conductive material 86 and a metal 84 are provided, and an electrode 85 is provided on both the metal material 84 and the dielectric materials 83. The ion conductive material 86 is solid electrolyte material like silver sulfide mentioned above. When a voltage is applied between the electrode 85 and the conductive material 82, the current path, called a dendrite, is formed on the surface of the ion conductive material 86, and the electrode 85 and the conductive material 82 are electrically connected. When the opposite voltage is applied, the dendrite disappears, and the electrode 85 and the conductive material 82 are electrically isolated.

The PCM as the sixth prior art utilizes the conductivity change that results from the phase change between a crystal and an amorphous phases in a chalcogenide semiconductor. The phase change of a chalcogenide semiconductor is the binary phase change between the crystal and the amorphous states which can be induced by heating and cooling it or by applying either one of two kinds of pulses with a varying pulse width and pulse amplitude. This phase change depends not on the applied voltage polarity but on the pulse width, amplitude, and so on, of the voltage pulse (see U.S. Pat. Application Publication No. U.S. 2002/0081804-A1).

The antifuse device as the first prior art is the switching device mainly used for FPGA, and is characterized by its short signal delay owing to the small resistance in the "on" state. However, this device cannot be re-programmed, therefore in the case of FPGA programming, such requests as debugging or program modification during operation cannot be met. On the other hand, the EEPROM as the second prior art is capable of re-programming, but its wiring is complex because of the three terminal structure and its integration density is low. The "on" resistance of this device is as large as several kΩ, as it is limited by the MOS transistor resistance. The electron device as the third prior art requires a gap between the mixed conductor and the counter electrode. Making a gap requires additional process that in turn lowers the yield.

As for the electron devices as the fourth and fifth prir arts, since the dendrite, which acts as the current path, is formed on the surface around solid electrolyte, it is questionable whether a high reliability is expected over a long period of time use.

Furthermore, for the electron device as the fifth prir art, the ion conductive material 86 is buried in the recess structure formed in the dielectric material 83. In order to bury the ion conductive material 86 into the recess structure, it is necessary to planarlize the surface by using CMP (Chemical Mechanical Polishing) method. Furthermore, in order to bury the metallic material 84 into the dielectric material 78 a recess has to be formed by using either a dry or wet etching method, which increases the complexity of the manufacturing process and hence increases the cost.

Furthermore, as for the electron device as the sixth prior art, since the crystal and amorphous phases are formed by heating chalcogenide semiconductor using two pulses of different wave shapes and changing the cooling time in effect, the control of pulse shape is complex and the resistance change is small.

DISCLOSURE OF THE INVENTION

Considering the problems described above, the object of the present invention is to provide a switching device which can maintain an on or off state when an electric source is switched off, has a low on state resistance, can be highly integrated, and is capable of being programmed in either the on or off state, and FPGA, memory device using the same, and method of manufacturing the same.

In order to achieve the object mentioned above, there is provided in accordance with the present invention thereof the first construction of a solid electrolyte switching device comprising: a substrate in which surface is coated with an insulation layer; a first interconnection layer set on said substrate; an ion supplying layer set on said first interconnection layer; a solid electrolyte layer set on said ion supplying layer, an interlevel insulating layer having a via hole set to cover said first interconnection layer, said ion supplying layer, and said solid electrolyte layer; a counter electrode layer set to contact said solid electrolyte layer through said via hole of said interlevel insulating layer, and a second interconnection layer set to cover said counter electrode layer.

The second construction of a solid electrolyte switching device of the present invention comprises: a substrate in which surface is coated with an insulation layer; a first interconnection layer set on said substrate; a counter electrode layer set on said first interconnection layer; a solid electrolyte layer set on said counter electrode layer; an interlevel insulating layer having a via hole set to cover said first interconnection layer, said counter electrode layer, and said solid electrolyte layer; an ion supplying layer set to contact said solid electrolyte layer through said via hole of said interlevel insulating layer; and a second interconnection layer set to cover said ion supplying layer.

According to the construction described above, when a negative voltage applied to the counter electrode layer relative to the ion supplying layer is lower than the threshold value, the resistance between the first and the second electrode layers decreases and the state transits to on. Conversely, when a positive voltage applied to the counter electrode layer relative to ion supplying layer is higher than the threshold value, the resistance between the first and the second electrode layers increases and the state transits to off. When an absolute value of the applied voltage is lower than the threshold value, or the power source is removed, the on or off state mentioned above is maintained. The resistance of the on state is lower than that of the MOS transistor of the same size.

According to the construction mentioned above, the solid electrolyte layer consists of preferably an ion conductive material, and the ion supplying layer consists of the material which supplies ions to the ion conductive material. The solid electrolyte layer may be any one of copper sulfide, chromium sulfide, silver sulfide, titanium sulfide, tungsten sulfide, nickel sulfide, tantalum sulfide, molybdenum sulfide, zinc sulfide, germanium-antimony-tellurium compound, and arsenic-tellurium-germanium-silicon compound. The ion supplying layer may be silver or copper.

According to the construction described above, the solid electrolyte layer preferably consists of the mixed conductive material in which ion conduction and electron conduction co-exist, and the ion supplying layer consists of the material which supplies ions to the mixed conductive materials.

The combination of the solid electrolyte layer and the ion supplying layer may be any one of copper sulfide and copper, chromium sulfide and chromium, silver sulfide and silver, titanium sulfide and titanium, tungsten sulfide and tungsten, nickel sulfide and nickel, and tantalum sulfide and tantalum.

Another construction of a solid electrolyte switching device in accordance with the present invention comprises: a substrate in which surface is coated with an insulation layer; a first interconnection layer set on said substrate; a solid electrolyte layer consisting of mixed conductive material which contains ion conductive material or metallic ions and in which the ion and the electron conductions co-exist set on said first interconnection layer; an interlevel insulating layer having a via hole set to cover said first interconnection layer and said solid electrolyte layer; a counter electrode layer set to contact said solid electrolyte layer through said via hole of said interlevel insulating layer; and a second interconnection layer set to cover said counter electrode layer; and said first interconnection layer contains metal which is contained in said solid electrolyte layer.

Still another construction of a solid electrolyte switching device in accordance with the present invention comprises: a substrate in which surface is coated with an insulation layer; a first interconnection layer set on said substrate; a solid electrolyte layer consisting of mixed conductive material which contains ion conductive material or metallic ions and in which the ion and the electron conductions co-exist set on said first interconnection layer; an interlevel insulating layer having a via hole formed on said substrate and set to cover said first interconnection layer and said solid electrolyte layer; a counter electrode layer set to contact said solid electrolyte layer through said via hole of said interlevel insulating layer; and a second interconnection layer set to cover said counter electrode layer; and said second interconnection layer contains the metal which is contained in said solid electrolyte layer.

The solid electrolyte layer described above is preferably metal sulfide, and the first or the second interconnection layer may contain the metal that is contained in the metal sulfide. The solid electrolyte layer may also be copper sulfide and the first or the second interconnection layer may be made of copper.

According to the construction described above, the first or the second interconnection layer is made of the same metal as that of the metallic ion of solid electrolyte layer, and since these interconnection layers act as the ion supplying layer, they function as the solid electrolyte switching device even without ion supplying layer. When a negative voltage applied to the a counter electrode layer relative to the ion supplying layer is lower than the threshold value, the resistance between the first and the second electrode layers decreases, and the state transits to on. Conversely, when a positive voltage applied to the counter electrode layer relative to the ion supplying layer is higher than the threshold value, the resistance between the first and the second electrode layers increases, and the state transits to off. When an absolute value of the applied voltage is lower than the threshold value or the power source is removed, the on or off state mentioned above is maintained. The resistance of the on state is lower than that of the MOS transistor of the same size.

The counter electrode layer may be any one or any combination of platinum, aluminum, copper, titanium, tungsten, vanadium, niobium, tantalum, chromium, molybdenum, and the nitride or the silicide of these metals.

The solid electrolyte switching device described above can have off characteristics in the initial state before voltage application. The solid electrolyte switching device can also have on characteristics in the initial state before voltage application.

It is also preferred that an input voltage or its application time is feedback controlled so as to make the on or off resistance to be the desired value for said solid electrolyte switching device to transit between on and off states.

An FPGA of the present invention is characterized in that the solid electrolyte switching device described above is used as a switching device for programming of FPGA. According to this construction, since the solid electrolyte switching device possesses non-volatile memory function, its threshold voltage to switch on and off states can be made higher than the signal voltage of FPGA, and its on resistance is low, the re-programmable high speed FPGA can be provided.

A memory cell which uses the solid electrolyte switching device of the present invention is characterized in that it has the solid electrolyte switching device described above and a MOS transistor, and said first or second interconnection layer of said solid electrolyte switching device is connected to the drain or source of said MOS transistor.

A memory cell which uses a solid electrolyte switching device of the present invention is also characterized in that it has the solid electrolyte switching device described above and a MOS transistor, and the first interconnection layer of said solid electrolyte switching device is connected to the drain of said MOS transistor, and the second interconnection layer of said solid electrolyte switching device is connected to a ground line, and the source of said MOS transistor is made an address line, and the gate of said MOS transistor is made a word line.

According to the construction described above, the desired memory cell can be selected by choosing word and address lines, and the on or off state can be written into the solid electrolyte switching device by turning on MOS transistor and applying a voltage higher than threshold value to the address and the ground lines. The data of memory can be read out from the solid electrolyte switching device by selecting the desired memory cell by choosing word and address lines, and sensing the resistance between the address and the ground lines by turning on MOS transistor. Therefore, according to the present invention, the non-volatile memory is provided in which high speed readout and high speed programming are possible.

A method of manufacturing the first construction of solid electrolyte switching device of the present invention comprises: a process to form a first interconnection layer on a substrate; a process to form an ion supplying layer on said first interconnection layer; a process to coat an interlevel insulating layer having a via hole on said ion supplying layer; a process to form a solid electrolyte layer through said via hole; a process to form a counter electrode layer contacted to said solid electrolyte layer through said via hole; and a process to form a second interconnection layer coating said counter electrode layer.

A method of manufacturing the second construction of solid electrolyte switching device of the present invention comprises: a process to form a first interconnection layer on a substrate; a process to form a counter electrode layer on said first interconnection layer; a process to coat an interlevel insulating layer having a via hole on said counter electrode layer; a process to form a solid electrolyte layer through said via hole; a process to form an ion supplying layer contacted to said solid electrolyte layer through said via hole; and a process to form a second interconnection layer coating said ion supplying layer.

In the construction described above, in case of forming of said solid electrolyte layer through via hole is characterized in that the process to form a solid electrolyte layer through said via hole is the process to sulfidize by anodic polarization said metal thin film as an anode in the aqueous solution of sodium sulfide with said interlevel insulating layer having said via hole as a mask.

The control of film thickness of said solid electrolyte layer is preferably that during said sulfidation for controlling the film thickness of said solid electrolyte layer, said solid electrolyte layer and said ion supplying layer are formed simultaneously by measuring and controlling the conductivity of said metal thin film.

The on voltage for said solid electrolyte switching device to transit from off state to on state is preferably applied by controlling the magnitude of voltage applied between said solid electrolyte layer and said counter electrode layer during manufacture, and by forming the desired threshold value of voltage.

The off voltage for said solid electrolyte switching device to transit from on state to off state is preferably applied by controlling the magnitude of voltage applied between said solid electrolyte layer and said counter electrode layer during manufacture, and by forming the desired threshold value of voltage.

According to the construction described above, a solid electrolyte switching device, and FPGA and the memory cells utilizing said solid electrolyte switching device can be manufactured at low cost and with high controllability.

BRIEF DESCRIPTION OF THE DRAWINGS

The present invention will better be understood from the following detailed description and the drawings attached hereto showing certain illustrative forms of embodiment of the present invention; in this connection, it should be noted that such forms of embodiment illustrated in the accompanying drawings hereof are intended in no way to limit the present invention but to facilitate an explanation and an understanding thereof, in which drawings:

FIG. 5 is a graph showing the current-voltage characteristics of a solid electrolyte switching device of the first embodiment of the present invention;

BEST MODES FOR CARRYING OUT THE INVENTION

Hereinafter, a detailed explanation is given in respect of embodiment of the present invention, references being made to Figures.

The first embodiment of a solid electrolyte switching device of the present invention is shown first.

Figure 1:
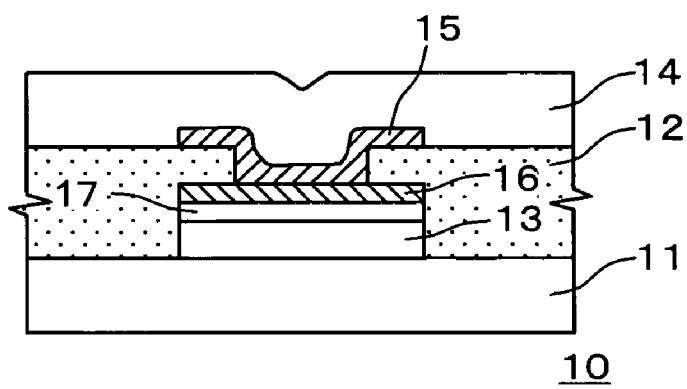
FIG. 1 is a partial cross-sectional view showing the structure of a solid electrolyte switching device of the first embodiment of the present invention.

FIG. 1 is a cross-sectional view showing the structure of a solid electrolyte switching device of a first embodiment of the present invention. As shown in FIG. 1, the solid electrolyte switching device 10 of the present invention comprises, for example, a first interconnection layer 13 set on a silicon substrate 11 on which the surface is coated with an insulation layer, an ion supplying layer 17 set on said first interconnection layer 13, a solid electrolyte layer 16 set on said ion supplying layer 17, and a counter electrode layer 15 set on the solid electrolyte layer 16 so as to contact said solid electrolyte layer 16 through a via hole of an interlevel insulating layer 12. A second interconnection layer 14 is formed on said counter electrode 15 to cover said counter electrode, and a space between said second interconnection layer and said substrate 11 is filled with said interlevel insulating layer 12. Furthermore, said first interconnection layer 13 becomes the lead electrode of said ion supplying layer 17, and said second interconnection layer 14 becomes the lead electrode of said counter electrode 15.

The material for the solid electrolyte layer 16 can be either ion conductive or the mixed conductive material that can conduct both ion and electrons. For mixed conductive material, for example, a metal sulfide such as copper sulfide is preferred. The ion supplying layer 17 is formed with the material consisting of the metal which is contained in the solid electrolyte layer 16, and the metal ion is supplied from the ion supplying layer 17 to the solid electrolyte layer 16, or the other way around. In case that copper sulfide is used, for example, as the material of the solid electrolyte layer 16, its film thickness of solid electrolyte layer 16 may approximately 2 nm to 200 nm, and the ion supplying layer 17 is formed with copper and its film thickness may be approximately 20 nm to 500 nm. The film thickness of the first interconnection layer 13 may be approximately 20 nm to 300 nm.

The combination of the solid electrolyte layer 16 and the ion supplying layer 17 may be, besides copper sulfide, which is the metal sulfide mentioned above, and copper, chromium sulfide and chromium, silver sulfide and silver, titanium sulfide and titanium, tungsten sulfide and tungsten, nickel sulfide and nickel, and tantalum sulfide and tantalum.

In case that the solid electrolyte layer 16 is made of the ion conductive material, either one of molybdenum sulfide, zinc sulfide, germanium-antimony-tellurium-compound, or arsenic-tellurium-germanium-silicon compound may be used besides the metal sulfides mentioned above, and ion supplying layer 17 may be of silver or copper.

The counter electrode layer 15 may be made of a material which would not cause chemical reaction with the mixed conductive material, and titanium may be used as this material. Platinum, aluminum, copper, tungsten, vanadium, niobium, tantalum, chromium, molybdenum, and the nitrides or silicides of these metals may be used besides titanium. Copper may be used for the first and second interconnection layer 13, and 14. Besides copper, such conventional interconnection materials typically used in integrated circuits as, for example, aluminum and gold may be used. When a voltage is applied to the first interconnection layer 13 and the second interconnection layer 14, the resistances of the first interconnection layer 13, the second interconnection layer 14, the ion supplying layer 17 and the counter electrode layer 15 are negligible because they are made of metals, and the most of the applied voltage is applied to the solid electrolyte layer 16.

Next, the structure of a solid electrolyte switching device of the second embodiment of the present invention is explained.

Figure 2:
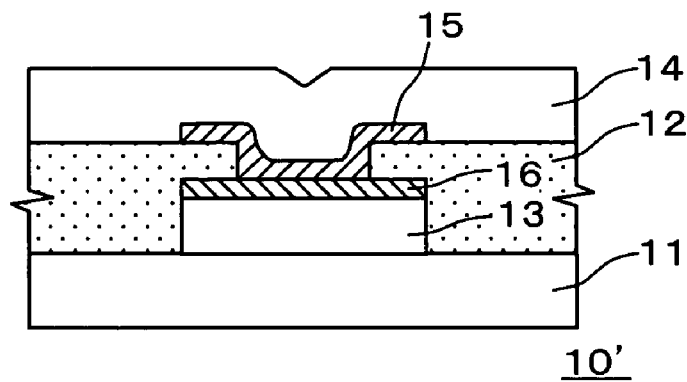
FIG. 2 is a partial cross-sectional view showing the structure of a solid electrolyte switching device of the second embodiment of the present invention.

FIG. 2 shows the structure of a solid electrolyte switching device of the second embodiment of the present invention. A solid electrolyte switching device 10' shown here has such structure in which the first interconnection layer 13 of the solid electrolyte switching device 10 shown in FIG. 1 is formed with the same metal as that for the ion supplying layer 17. In this case, since the first interconnection layer 13 itself can be the ion supplying source to the solid electrolyte layer 16, the ion supplying layer 17 can be omitted and the solid electrolyte layer 16 can be set on the first interconnection layer 13. Other parts of structure are the same as in FIG. 1, and the explanation is not detailed. Here the solid electrolyte layer 16 may be of copper sulfide, and the first interconnection layer 13 of copper. The solid electrolyte layer 16 may also be of a metal sulfide, and the first interconnection layer 13 may contain the same metal that is contained in the said metal sulfide.

Next, the structure of a solid electrolyte switching device of the third embodiment of the present invention is explained.

Figure 3:
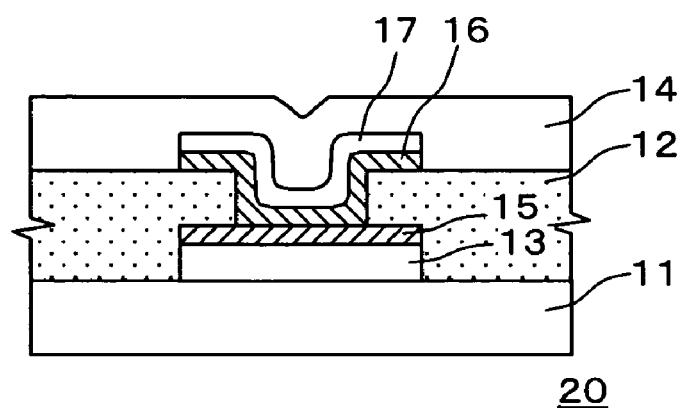
FIG. 3 is a partial cross-sectional view showing the structure of a solid electrolyte switching device of the third embodiment of the present invention.

FIG. 3 shows the structure of a solid electrolyte switching device of the third embodiment of the present invention. As shown in FIG. 3, a solid electrolyte switching device 20 is formed by depositing the counter electrode layer 15 on the first interconnection layer 13, the solid electrolyte layer 16 on the said counter electrode layer 15, the ion supplying layer 17 on said solid electrolyte layer 16, and the second interconnection layer 14 on said ion supplying layer 17. This structure is deposited in the reverse order than detailed in the solid electrolyte switching device 10 of the first embodiment of the present invention where the order of deposition is the ion supplying layer 17, the solid electrolyte layer 16, and the counter electrode layer 15.

The solid electrolyte switching device 20 comprises, for example, the first interconnection layer 13 set on the silicon substrate 11 in which surface is coated with an insulating layer, the counter electrode layer 15 set on the first interconnection layer 13, the solid electrolyte layer 16 set on the counter electrode layer 15 through a via hole of the interlevel insulating layer 12, and the ion supplying layer 17 set on the solid electrolyte layer 16 so as to contact the solid electrolyte layer 16. The second interconnection layer 14 is set on the ion supplying layer 17 to cover the ion supplying layer 17, and a space between the second interconnection layer and the substrate 11 is filled with the interlevel insulating layer 12. The first interconnection layer 13 becomes the lead electrode of the counter electrode layer 15, and the second interconnection layer 14 becomes the lead electrode of the ion supplying layer 17.

The material used for solid electrolyte layer 16, may be either ion conductive material or the mixed conductive material that can conduct both ion and electron. For the mixed conductive material, for example, a metal sulfide such as copper sulfide may be used. The ion supplying layer 17 is formed with the material consisting of the metal which is contained in solid electrolyte layer 16, and the metal ion is supplied from the ion supplying layer 17 to the solid electrolyte layer 16, or the other way around. In case that copper sulfide is used, for example, as the material of the solid electrolyte layer 16, the film thickness of solid electrolyte layer 16 may be approximately 2 nm to 200 nm, and the ion supplying layer 17 is formed with copper and its film thickness may be approximately 20 nm to 500 nm. The film thickness of the second interconnection layer 14 may be approximately 20 nm to 300 nm.

The combination of the solid electrolyte layer 16 and the ion supplying layer 17 may be, besides copper sulfide which is the metal sulfide mentioned above and copper, chromium sulfide and chromium, silver sulfide and silver, titanium sulfide and titanium, tungsten sulfide and tungsten, nickel sulfide and nickel, and tantalum sulfide and tantalum.

In case that the solid electrolyte layer 16 is made of the ion conductive material, either one of molybdenum sulfide, zinc sulfide, germanium-antimony-tellurium compound, or arsenic-tellurium-germanium-silicon compound may be used besides metal sulfides mentioned above, and the ion supplying layer 17 may be of silver or copper.

The counter electrode layer 15 may be made of a material which would not cause chemical reaction with a mixed conductive material. Titanium may be used as the material for counter electrode layer 15. Platinum, aluminum, copper, tungsten, vanadium, niobium, tantalum, chromium, molybdenum, and the nitrides or silicides of these metals may be used besides titanium. Copper may be used for the first interconnection layer 13 and the second interconnection layer 14. Besides copper, such conventional interconnection materials for integrated circuits as, for example, aluminum and gold may be used. When a voltage is applied to the first interconnection layer 13 and the second interconnection layer 14, the resistances of the first and the second interconnection layer 13, 14, the ion supplying layer 17 and the counter electrode layer 15 are negligibly small because they are made of metals, and the most of the applied voltage is applied to the solid electrolyte layer 16.

Next, the structure of a solid electrolyte switching device of the fourth embodiment of the present invention is explained.

Figure 4:
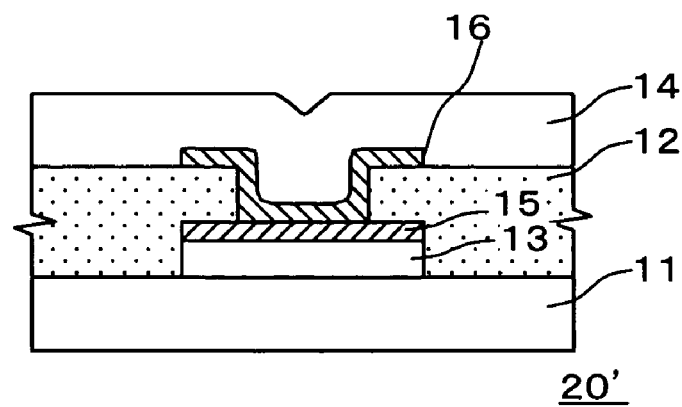
FIG. 4 is a partial cross-sectional view showing the structure of a solid electrolyte switching device of the fourth embodiment of the present invention.

FIG. 4 shows the structure of a solid electrolyte switching device of the fourth embodiment of the present invention. The solid electrolyte switching device 20' shown here has such a structure in which the second interconnection layer 14 of the solid electrolyte switching device 20 shown in FIG. 3 is formed with the same metal as that for the ion supplying layer 17. In this case, since the second interconnection layer 14 itself can be the ion supplying source to the solid electrolyte layer 16, the ion supplying layer 17 can be omitted and the second interconnection layer 14 can be set on the solid electrolyte layer 16. Other parts of structure are the same as in FIG. 3, and the explanation is not detailed. Here the solid electrolyte layer 16 may be of copper sulfide, and the second interconnection layer 14 of copper. The solid electrolyte layer 16 may also be of a metal sulfide, and the second interconnection layer 14 may contain the same metal that is contained in the said metal sulfide.

Next, the function of a solid electrolyte switching device of the first embodiment of the structure mentioned above is explained.

FIG. 5 shows the current-voltage characteristics of the solid electrolyte switching device 10 of the first embodiment of the present invention. The material, shape, and thickness of each layer of the samples used for measurement are shown below. Substrate 11 is the 500 μm thick Si substrate with 200 nm thick Si dioxide film formed on it, and the 50 nm thick gold is used as the first interconnection layer 13. The 60 nm thick copper is used as the ion supplying layer 17. The 20 nm thick copper sulfide as the solid electrolyte layer 16, the 10 nm thick titanium as the counter electrode layer 15, and the 50 nm thick platinum as the second interconnection layer 14 are used. A via hole of 0.03 to 0.3 μm is formed in the interlevel insulating layer 12, and the contact area between the solid electrolyte layer 16 and the counter electrode layer 15 is confined. As the interlevel insulating layer, a polymer called "chloromethylated calix arene" is used.

In FIG. 5, the horizontal axis shows the voltage applied between the second interconnection layer 14 and the first interconnection layer 13 with the second interconnection layer 14 as positive, and the vertical axis shows the current flowing in the solid electrolyte layer 16. As is seen in FIG. 5, the current-voltage characteristic of the solid electrolyte switching device of the present invention has a hysteresis property. These current-voltage characteristics had not previously been seen, and was discovered first by the present inventors.

(1) Right after the solid electrolyte switching device 10 is manufactured, the conductivity is as low as 7 nS (lower than the measurement limit) in the off state. The off state is maintained with the applied voltage in the range of –0.28V to 0.3V (FIG. 5, • and •).

(2) When the applied voltage is lower than –0.28V, current starts flowing suddenly and the state transits to a high conductive state, that is, an on state (FIG. 5, •). While the applied voltage increases from about –0.15V to about 0.07V, the current increases proportionally to the applied voltage, and shows the high conductive state, that is, the on state. The on resistance is extremely low, approximately 50 Ω in this instance. With the applied voltage changing in the range from –0.15V to about 0.07V, the on state is maintained (FIG. 5, ③).

(3) When the applied voltage is higher than about 0.07V, current suddenly stops flowing, and the state returns to low conductive off state (FIG. 5, ④). Once the state turns off, it is maintained regardless whether the voltage is applied or not (FIG. 5, ⑤).

As is seen here, the solid electrolyte switching device 10 of the present invention has the hysteresis characteristics as shown in the (1), (2), and (3) mentioned above. The electrical property shown in FIG. 5 is that of the electron device with a via hole of diameter 0.03 μm. Similar hysteresis characteristics can be seen for all electron devices up to 0.3 μm. The off/on resistance ratio of solid electrolyte switching device 10 is higher than 106. The conductivity of the on state shows a tendency to increase as the device temperature decreases, and increases by about 10% at 77K.

Next, another current-voltage characteristics of a solid electrolyte switching device of the first embodiment of the structure mentioned above is explained.

Figure 6:
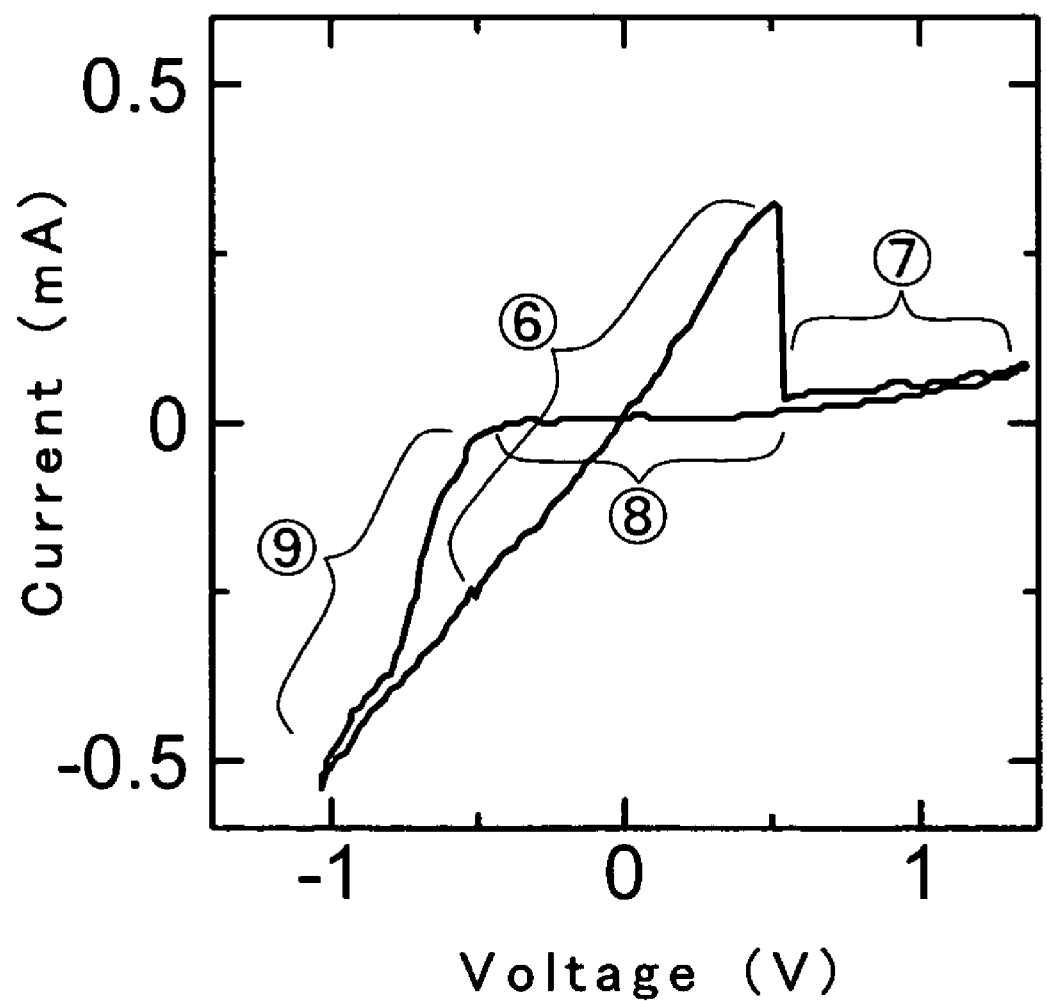
FIG. 6 is a graph showing another current-voltage characteristics of a solid electrolyte switching device of the first embodiment of the present invention.

FIG. 6 shows another current-voltage characteristics of a solid electrolyte switching device of the first embodiment of the present invention. The material, shape, and thickness of each layer of the samples used for measurement are shown below. The substrate 11 is the 500 μm thick Si substrate with 200 nm thick $SiO_2$ film formed on it, and the 60 nm thick copper as the first interconnection layer 13, the 60 nm thick copper sulfide with circular area of 0.5 μmφ as the solid electrolyte layer 16, the 10 nm thick titanium as the counter electrode layer 15, and the 50 nm thick platinum as the second interconnection layer 14 are used.

In FIG. 6, the horizontal axis shows the voltage applied between the second interconnection layer 14 and the first interconnection layer 13 with the second interconnection layer 14 as positive, and the vertical axis shows the current flowing in the solid electrolyte layer 16. As is seen in FIG. 6, the current-voltage characteristic of the solid electrolyte switching device of the present invention has a hysteretic property. This current-voltage characteristics had so far not been known as in the case of FIG. 5, and was discovered first by the present inventors.

(4) While the applied voltage increases from about –0.5V to about 0.5V, current increases proportionally to the applied voltage, and shows the high conductive state, that is, an on state. The on resistance is extremely low, as low as about 800 Ω in this instance. The on state is maintained regardless whether the voltage is applied or not. That is, however frequently the voltage is switched on or off in the range of –0.5V to about 0.5V, the resistance of about 800 Ω is maintained (FIG. 6, ⑥).

(5) When the applied voltage exceeds about 0.5V, the current stops flowing and the state transits to the low conductive off state (FIG. 6, •). Once the state becomes off, it is maintained regardless whether the voltage is applied or not. That is, however frequently the voltage is switched on or off in the range of –0.5V to about 0.5V, the low conductive off state is maintained (FIG. 6, ⑧).

(6) When a voltage of more than approximately 0.5V is applied in the negative direction, the current suddenly starts flowing and the state returns to that of the high conduction with the resistance of about 800 Ω at about –1V, that is, the on state (FIG. 6, ⑨).

The solid electrolyte switching device 10 of the present invention has the hysteresis characteristics as shown in the (4), (5), and (6) mentioned above. The on resistance can take any desired value by so designing the thickness, the area, and else of each layer.

The current-voltage characteristics which is explained in FIG. 6 above can be considered as follows.

When the voltage higher than approximately 0.5V is applied to the second interconnection layer 14, metal ions in the solid electrolyte layer 16 moves to the ion supplying layer 17 side, and the layer deficient of metal ions is formed in the neighborhood of the interface between the counter electrode layer 15 and the solid electrolyte layer 16. Since this ion deficient layer has low electric conductivity, then the electric conductivity of the solid electrolyte switching device 10 is low (off state). On the other hand, when the applied voltage is lower than about –0.5V, copper ions are supplied from the ion supplying layer 17, and the copper ions move back to the original site so the conductivity recovers (on state). Since the conduction by electrons also contributes to the electric conductivity of solid electrolyte layer 16 in the on state, so it is considered that the on resistance of solid electrolyte switching device 10 of the present invention becomes extremely low.

As has been described, the off and the on states can be re-written by the solid electrolyte switching device 10, and the on or off state can be maintained when the power source is switched off. Further, the resistance of the on state can be made lower than that of MOS type memory.

As for the function of the solid electrolyte switching device 10 of the first embodiment of the present invention, two examples shown in FIGS. 5 and 6 are explained above, and also the similar current-voltage characteristics can be obtained by the solid electrolyte switching device (10', 20, and 20') of the second to fourth embodiments of the present invention.

Figure 7:
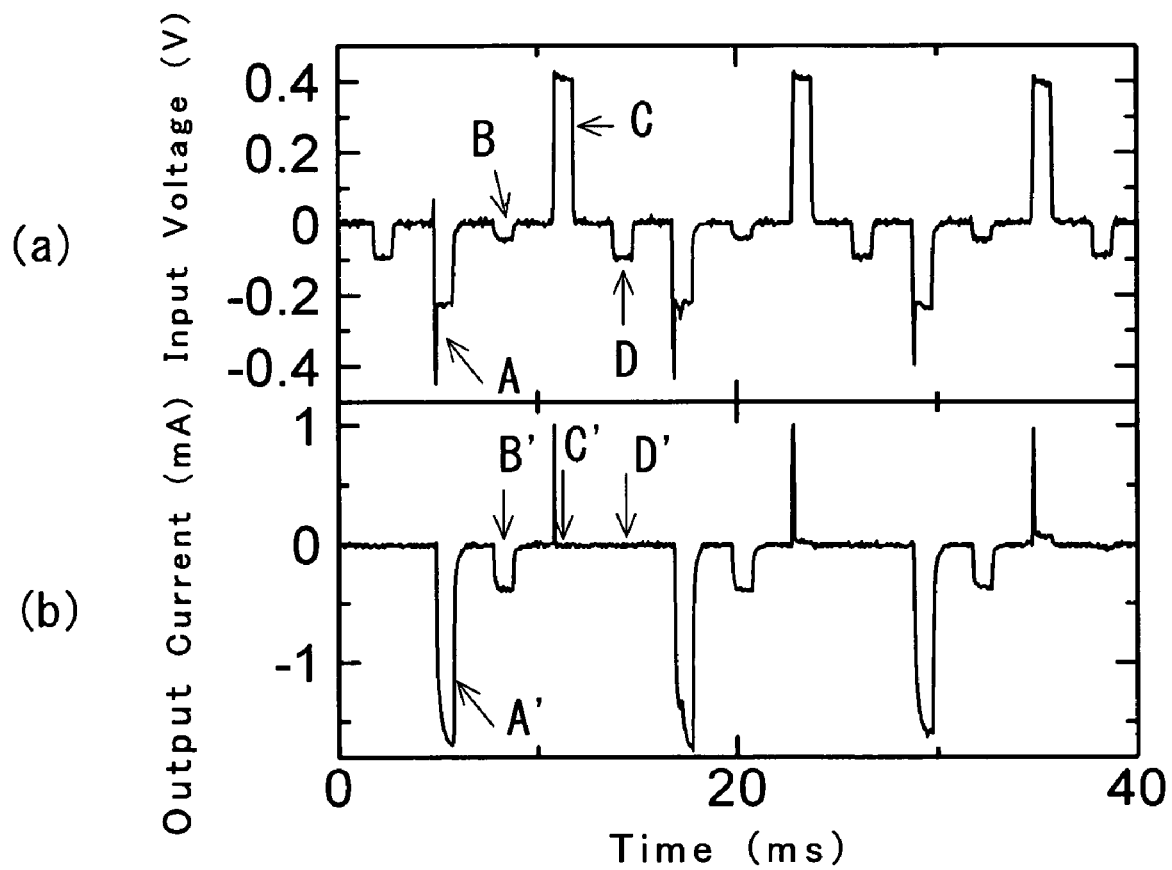
FIG. 7 shows the switching waveform from pulse voltage applied to a solid electrolyte switching device of the first embodiment of the present invention which has the current-voltage characteristics of FIG. 5, (a) shows the input pulse voltage waveform applied on a solid electrolyte switching device, and (b) shows the pulse current waveform of a solid electrolyte switching device.

FIG. 7 shows the pulsed voltage driven switching waveform of a solid electrolyte switching device 10 of the first embodiment of the present invention which has the current-voltage characteristics of FIG. 5. FIG. 7(a) shows the input pulse voltage waveform applied on the solid electrolyte switching device 10, and FIG. 7(b) shows the pulse current waveform of the solid electrolyte switching device 10. The vertical axis of the figure shows the amplitude of each pulse waveform, and the horizontal axis is time (ms).

As is shown on the left side of FIG. 7(a), the solid electrolyte switching device 10 is in the off state that a current does not flow where the negative voltage pulse of about −0.1V with 1 ms pulse width is applied.

When the negative voltage pulse of about −0.4V with 1 ms pulse width is applied as the first pulse to the solid electrolyte switching device 10 from this off state (FIG. 7(a), A), the solid electrolyte switching device 10 transits from the off to the on state (FIG. 7(b), A'). This on state can be seen from the fact that the current pulse (FIG. 7(b), B') can be obtained by applying, for example, a negative voltage pulse of approximately −0.1V with 1 ms pulse width (Refer to FIG. 7(a), B).

Next, when the positive voltage pulse of about 0.4V with 1 ms pulse width is applied, as the second voltage pulse (FIG. 7(a), C), the solid electrolyte switching device 10 transits from the on to the off state (FIG. 7(b), C'). This off state can be seen from the fact that current pulse (FIG. 7(a), D') can be obtained by applying, for example, the negative voltage pulse of approximately −0.1V with 1 ms pulse width (FIG. 7(b), D). The fact that the value set at the pulse voltage source differs from the pulse input voltage applied to the device shown in the figure is because the voltage drop occurs in a measurement apparatus when the current flows in it.

The switching time required for the transit from on state to off state, or vise versa, of the solid electrolyte switching device 10 mentioned above is about 100 μs, and it tends to be shorter as the applied pulse voltage is increased.

As the generation mechanism of current-voltage characteristics explained in FIG. 5 mentioned above, two models are thought as possible.

As the first generation mechanism model of current-voltage characteristics, it is thought possible that when the voltage lower than the negative threshold value (−0.28V) is applied to the solid electrolyte switching device in the off state as the first voltage pulse mentioned above, copper ions are supplied as metal ions from the ion supplying layer 17 to the solid electrolyte layer 16, and the conductivity becomes higher (on state). Since the conduction by electrons also contributes to the electric conductivity of the solid electrolyte layer 16 in the on state, it is assumed that the on resistance of the solid electrolyte switching device 10 of the present invention becomes extremely low. This model is similar to the mechanism of the current-voltage characteristics explained in FIG. 6 above except that the threshold voltage differs.

Next, when a voltage higher than the positive threshold value (0.07V) is applied as the second voltage pulse mentioned above, metal ions in the solid electrolyte layer 16 move to the ion supplying layer 17 side, and the layer, deficient of metal ions, is formed in the neighborhood of the interface between the counter electrode layer 15 and the solid electrolyte layer 16. Since this ion deficient layer has a low electric conductivity, the electric conductivity of solid electrolyte switching device 10 becomes low, and the state transits to off again.

As the second generation mechanism model of current-voltage characteristics, it is thought possible that metal filaments are formed as the current path in the solid electrolyte layer 16.

Figure 8:
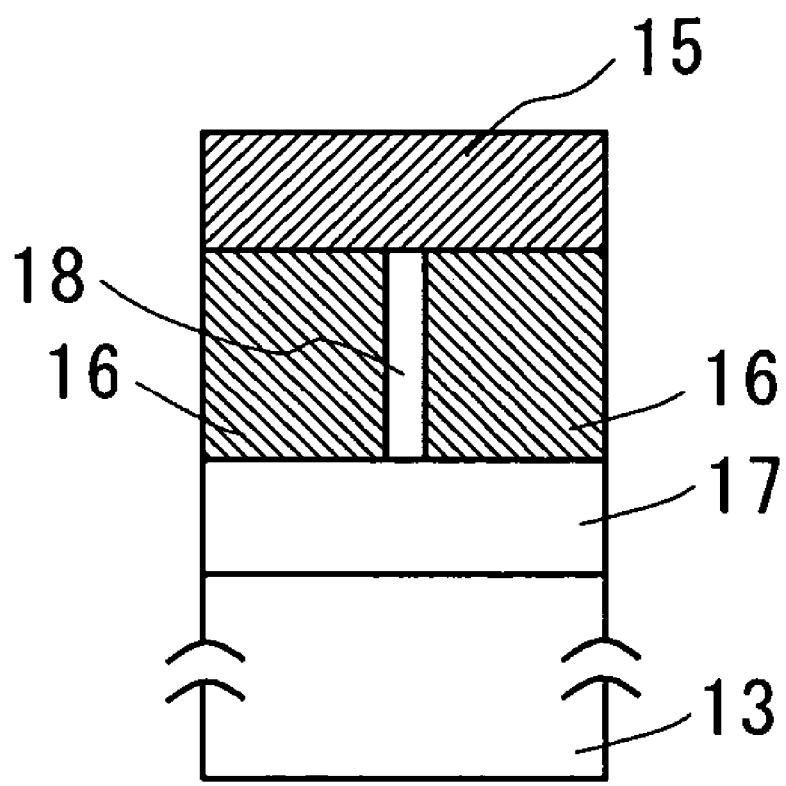
FIG. 8 is a cross-sectional view to illustrate the model of metal filament formation with regard to a solid electrolyte switching device.

FIG. 8 is a cross-sectional view to illustrate the model of a metal filament 18 formation with regard to a solid electrolyte switching device, and is the enlarged view of the central part of active layers consisting of the first interconnection layer 13, the ion supplying layer 17, the solid electrolyte layer 16, and the counter electrode layer 15 of the solid electrolyte switching device 10 of the present invention shown in FIG. 1.

Right after solid electrolyte switching device 10 is manufactured, that is, at the initial state before the voltage application, the metal filament 18 are not yet formed and the conductivity is low. When the negative threshold value (−0.28V) is applied as the first voltage pulse described above, the copper ions from copper sulfide of solid the electrolyte layer 16, moves between the first interconnection layer 13 and the counter electrode layer 15, and the metal filament, 18, of copper is formed and then the conductivity becomes higher. On the other hand, when a voltage higher than the positive threshold value (0.07V) is applied such as the voltage pulse mentioned above, the metal filament 18 disappears and the state turns to off.

Thus, the model of formation and disappearance of the metal filament 18 in the solid electrolyte layer 16 by change of the applied voltage polarity, as the second model for the current-voltage characteristics, can explain the linear current-voltage characteristics and the negative temperature coefficient of the conductivity as shown in FIG. 5.

Figure 9:
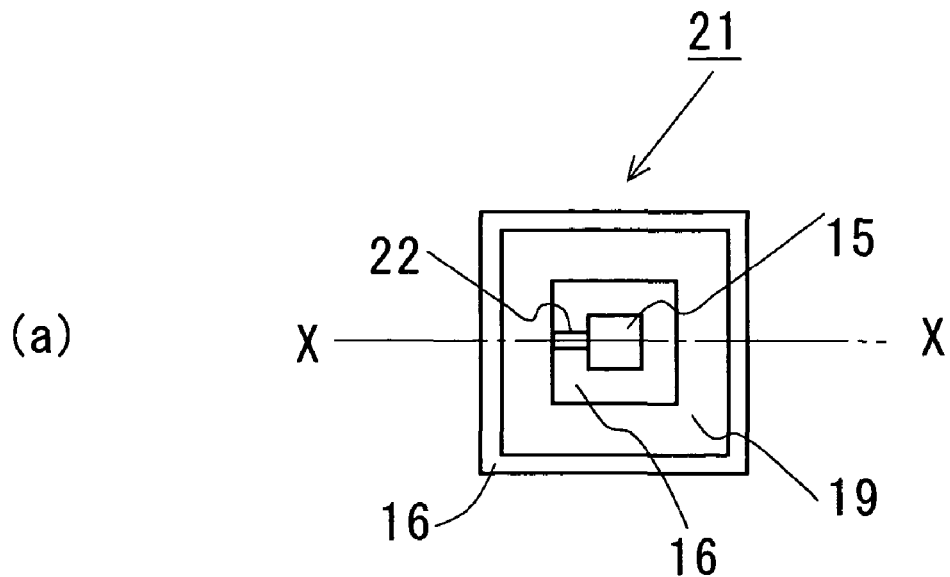
FIG. 9 is the structure of the solid electrolyte switching device which was test-manufactured to study the current path of a solid electrolyte switching device of the first embodiment of the present invention, (a) is a plane view, and (b) is a cross-sectional view along line X-X of (a)
Figure 9:
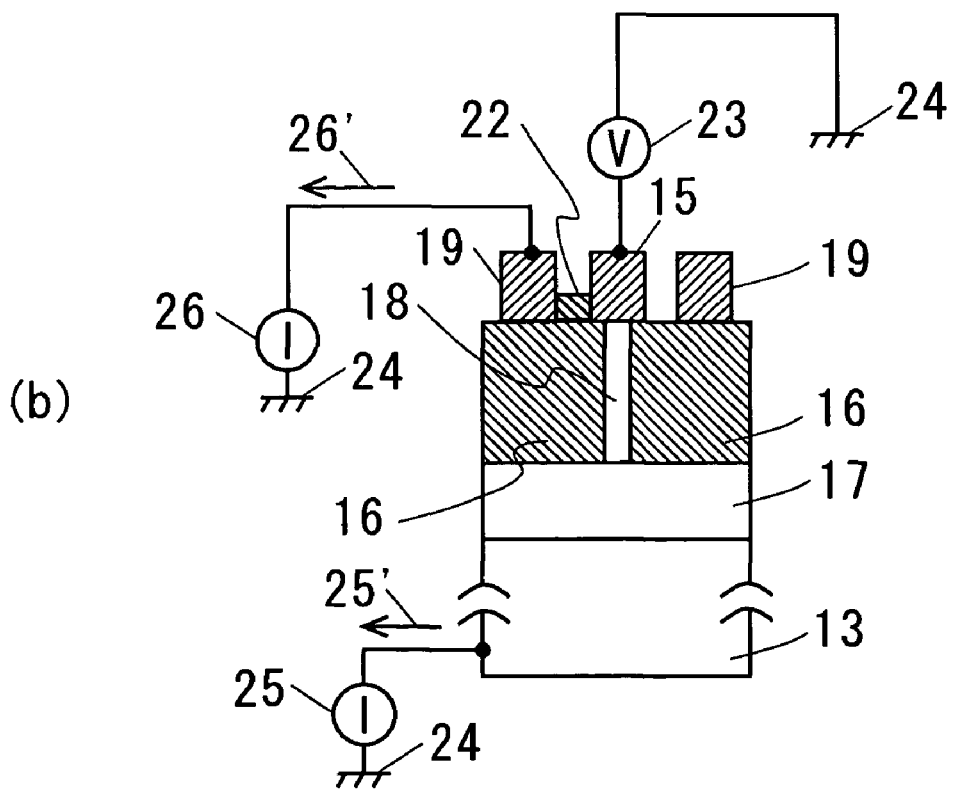
Figure 10:
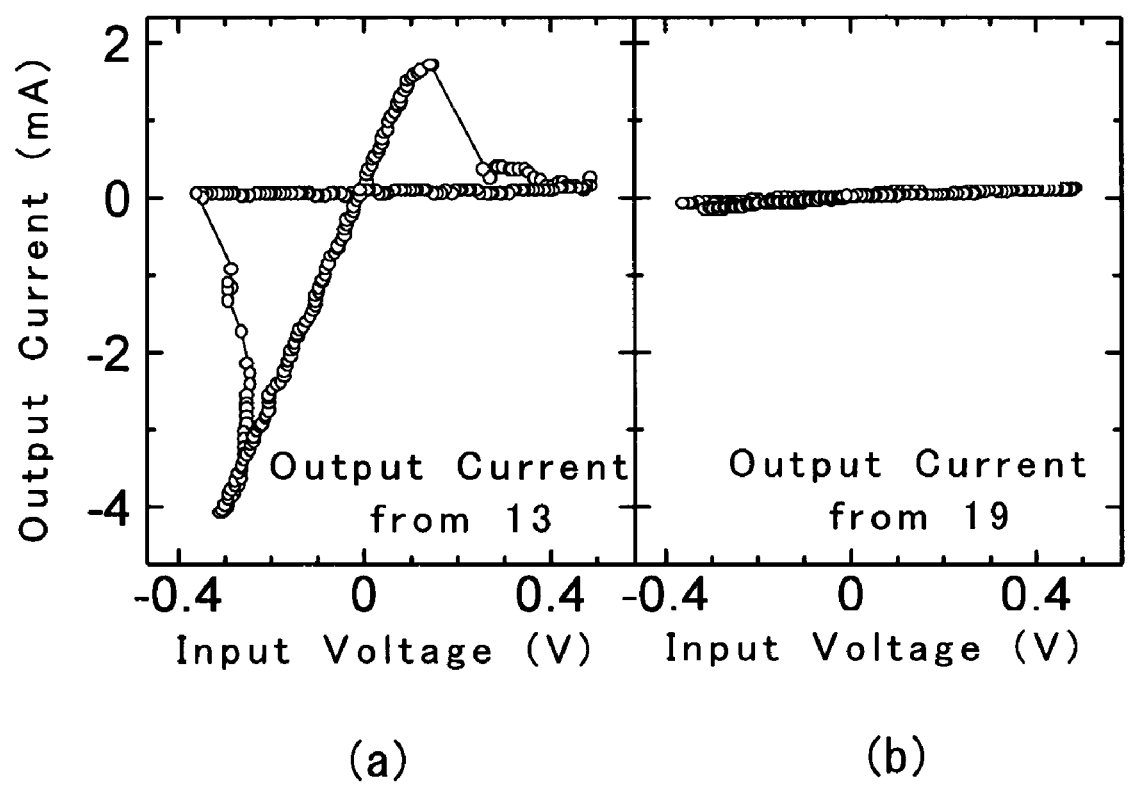
FIG. 10 shows the current-voltage characteristics of a solid electrolyte switching device of FIG. 9, (a) is the output current flowing into the first interconnection layer as to the input voltage applied to the counter electrode layer with the first interconnection layer and the second counter electrode layer grounded, and (b) is the output current flowing into the second counter electrode layer as to the input voltage applied to the counter electrode layer with the first interconnection layer and second counter electrode layer grounded.

As for the second mechanism of metal filament generation 18 mentioned above, the explanation is made with reference to FIGS. 9 and 10, if this metal filament 18 is formed, as to where it is formed in the solid electrolyte switching device 10.

FIG. 9 shows the structure of a solid electrolyte switching device 21 which was fabricated to study a current path in the solid electrolyte switching device 10 of the present invention as shown in FIG. 1. FIG. 9(a) is a plane view, and FIG. 9(b) is a cross-sectional view along line X-X. Also in FIG. 9(b) a circuit to study the current path is illustrated.

As illustrated, the structure of the solid electrolyte switching device 21 which was fabricated to study the current path of solid electrolyte switching device 10 is installed with a new second counter electrode, 19, around the solid electrolyte layer, 16, insulated from the counter electrode layer 15. Further, a DC voltage source 23 is connected between the counter electrode layer 15 and a ground 24. And an ampere meter 25 is connected between the first interconnection layer 13 and the ground 24, and an ampere meter 26 is connected between the second counter electrode layer 19 and the ground 24, respectively. Here assume that the currents flowing in the ampere meters 25 and 26 are the output currents 25' and 26', respectively. Since the internal resistances of ampere meters 25 and 26 are sufficiently small, the first interconnection layer 13 and the second counter electrode layer 19 are grounded equivalently.

First, the case that a current path 22 such as dendrite, that is, needle crystals are formed around the solid electrolyte layer 16 is discussed.

In this case it is assumed that the current flows between the counter electrode layer 15 of the solid electrolyte switching device 21 and the second counter electrode layer 19, and it does not flow from the counter electrode layer 15 to the first interconnection layer 13.

The model of the metal filament formation mentioned above is also discussed. It is assumed that since the current flows by copper ions inside the solid electrolyte layer 16, the current path 22 is not formed around the solid electrolyte layer 16, but the current flows in the first interconnection layer 13 and the counter electrode layer 15 of the solid electrolyte switching device 21, and a current does not flow to the second counter electrode layer 19.

FIG. 10 shows the current-voltage characteristics of solid electrolyte switching device 21 that was fabricated to study the current path in solid electrolyte switching device 10 of the present invention as shown in FIG. 9. FIG. 10($a$) is the output current 25' flowing out of the first interconnection layer 13 with respect to the input voltage applied to the counter electrode layer 15 when the first interconnection layer 13 and the second counter electrode layer 19 are grounded. And FIG. 10($b$) is the output current 26' flowing out of the second counter electrode layer 19 with respect to the input voltage applied to the counter electrode layer 15 when the first interconnection layer 13 and the second counter electrode layer 19 are grounded. As shown in FIG. 10($a$), the current flowing in the solid electrolyte layer 16 with respect to the voltage between the first interconnection layer 13 and the counter electrode layer 15 shows the current-voltage characteristics similar to that of the solid electrolyte switching device 10 of the present invention shown in FIG. 5 (Refer to FIG. 5 and FIG. 10($b$)). On the other hand, as shown in FIG. 10($b$), a current does not flow in the second counter electrode layer 19 located around the counter electrode layer 15 (FIG. 10($b$)).

It is clear from these observations that the current path 22 by the dendrite is not formed around the solid electrolyte layer 16 as shown in FIG. 9 but the switching function is performed by the action inside the solid electrolyte layer 16 in the solid electrolyte switching device 10 of the present invention.

Further, as for the solid electrolyte switching device 10, the copper sulfide thin film used in the solid electrolyte layer 16 is a sort of chalcogenide semi-conductor, but since the transition between the on and the off states depends on the voltage polarity, it is not considered that it is the the current-voltage characteristics caused by the phase change of chalcogenide semiconductor (see U.S. Patent Application Publication No. U.S. 2002/0081804-A1).

It is thus considered from the discussion above that the region where current-voltage characteristics of the solid electrolyte switching device 10 of the present invention occurs is not caused by dendrite formed around the solid electrolyte layer, but caused by the first and second phenomena inside the solid electrolyte layer 16 mentioned above.

Next, a control method of the on or off resistance of the solid electrolyte switching device of the present invention is explained.

Figure 11:
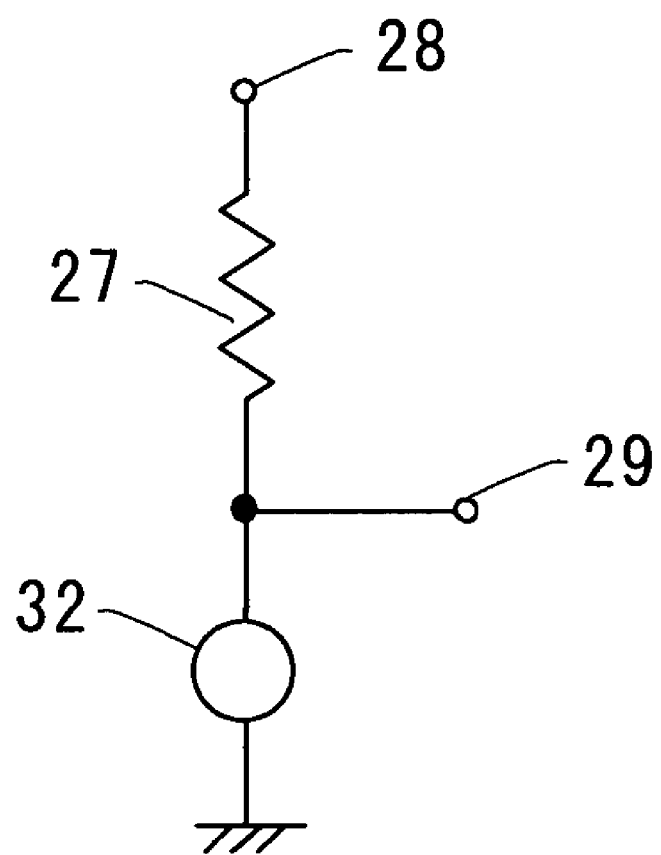
FIG. 11 shows an example of the electric circuit controlling the on or the off resistance of the solid electrolyte switching device of the present invention.

FIG. 11 shows an example of the electric circuit controlling the on or the off resistance with regard to a solid electrolyte switching device of the present invention. One end of a solid electrolyte switching device 32 of the present invention is grounded, and the other end is connected to an input voltage source 28 via a load resistance 27. An output voltage 29 of the solid electrolyte switching device is a voltage between the connection point of the solid electrolyte switching device and the load resistance 27 and the ground. Here the solid electrolyte switching device 32 is that described in either one of Embodiments 1 to 4.

Figure 12:
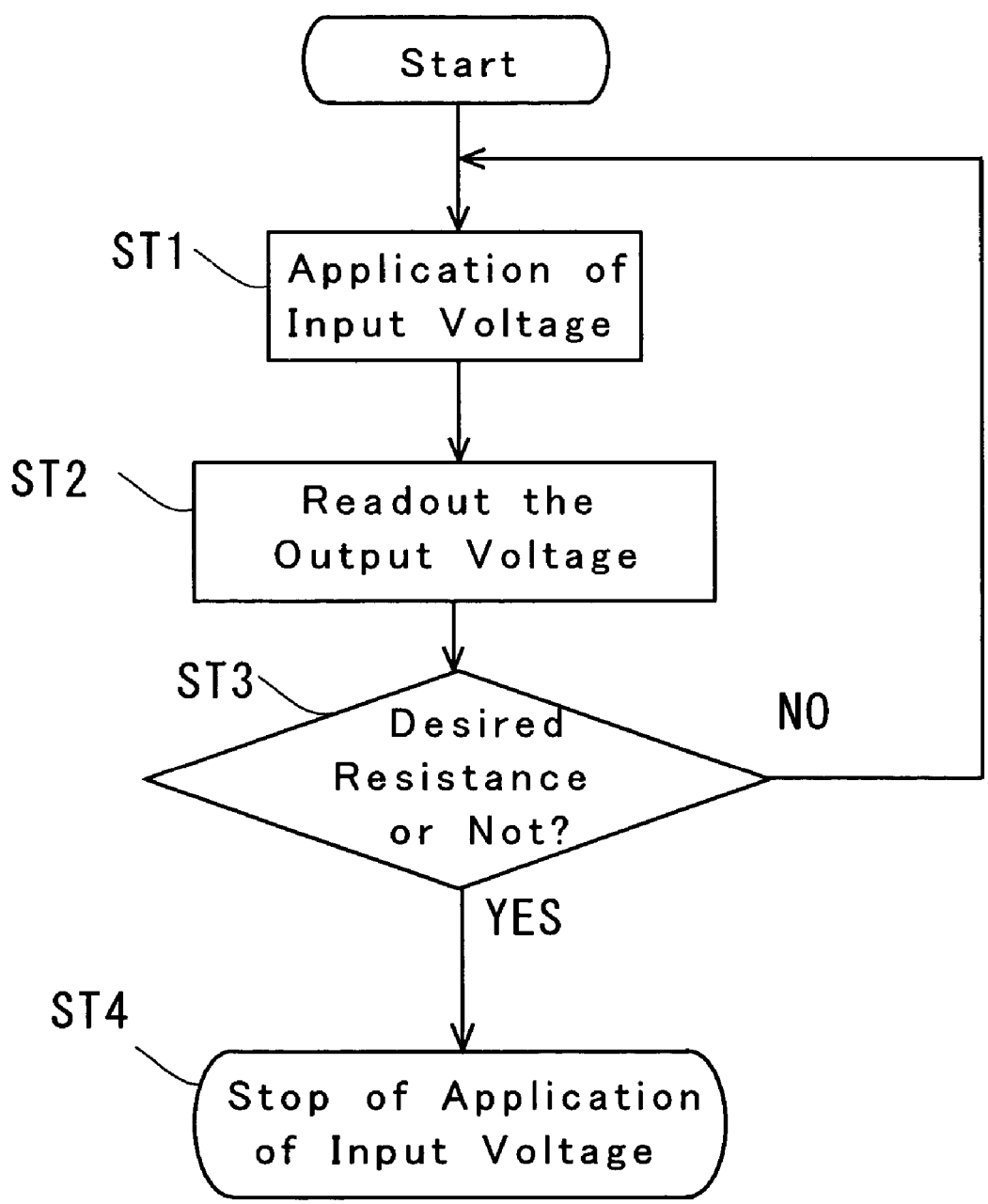
FIG. 12 is the flowchart showing the feedback control method to control the output voltage of a solid electrolyte switching device of the present invention to a predetermined value.

FIG. 12 is a flowchart showing a feedback control method to control an output voltage of a solid electrolyte switching device of the present invention to a predetermined value;

First at Step ST1, an input voltage starts to apply to a solid electrolyte switching device, and at Step ST2 the readout of output voltage of the solid electrolyte switching device is conducted, and at Step ST3 the judgment of whether the voltage of solid electrolyte switching device has reached to the predetermined value is conducted. If it is judged that the output voltage of the solid electrolyte switching device has not reached to the predetermined value, the procedure is returned to Step ST1, and a more voltage is applied to the solid electrolyte switching device. On the other hand, if it is judged at Step ST3 that the voltage of solid electrolyte switching device has reached to the predetermined value, the voltage application to the solid electrolyte switching device is ended at Step ST4.

The input voltage to the solid electrolyte switching device 10 is thus feedback controlled and applied so as to obtain the predetermined value.

Figure 13:
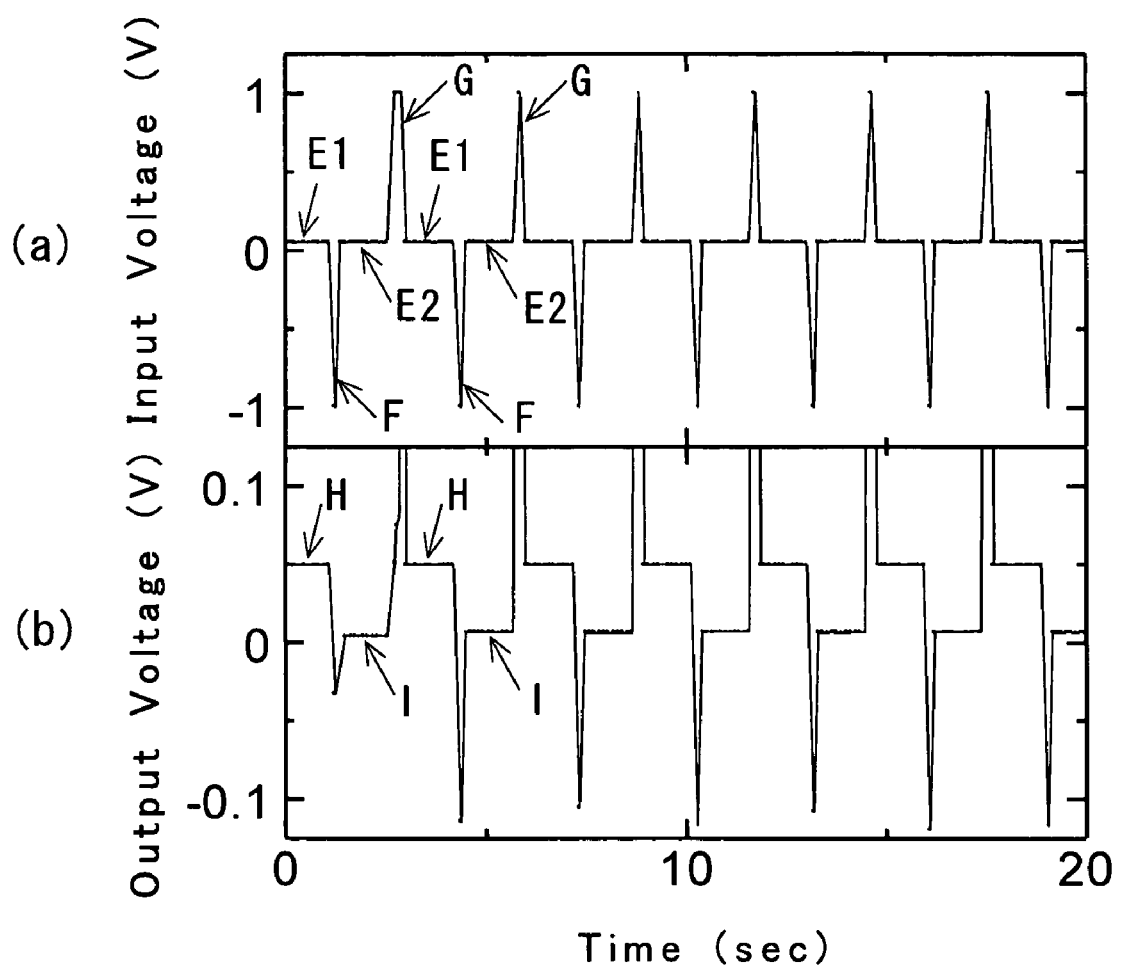
FIG. 13 shows a feedback control waveform of the input voltage and the corresponding output voltage waveform of the solid electrolyte switching device having the current-voltage characteristics of FIG. 5, (a) shows the input voltage waveform applied on the solid electrolyte switching device, and (b) shows the output voltage waveform of the solid electrolyte switching device.

FIG. 13 shows a feedback control waveform of the input voltage and the corresponding output voltage waveform with regard to a solid electrolyte switching device of the first embodiment of the present invention having the current-voltage characteristics of FIG. 5. FIG. 13($a$) shows the input voltage waveform applied to the solid electrolyte switching device 10, and FIG. 13($b$) shows the output voltage waveform of the solid electrolyte switching device 10. The horizontal axis of FIG. 13 is time (sec).

As shown in FIG. 13($a$), the sequence of voltage inputs comprising the positive voltage E1 of 50 mV, the voltage F, to turn from off to on, (to be called turn-on voltage F from here on), the positive voltage E2 of 50 mV, and the voltage G to turn from on to off (to be called turn-off voltage G from here on) are applied repeatedly to the solid electrolyte switching device 10.

Here the turn-on voltage F and the turn-off voltage G are applied, respectively, by feedback controlling the output voltage. The switching measurement circuit of the solid electrolyte switching device 10 is composed of an electric circuit set on a board, and is feedback controlled using a personal computer.

As is shown on the left side end of FIG. 13($a$), since the solid electrolyte switching device 10 is in the off state when input voltage E1 is applied to the solid electrolyte switching device 10, the output voltage is 50 mV, approximately equal to the input voltage (FIG. 13($b$), H).

Next, when the feedback controlled turn-on voltage F is applied, the solid electrolyte switching device 10 turns to the on state, and the output voltage becomes approximately 0V (FIG. 13($b$), I). It can be judged that the solid electrolyte switching device 10 maintains the on state by the fact that the output voltage maintains 0V while the positive voltage E2 of 50 mV amplitude is applied after the turn-on voltage F.

Next, the solid electrolyte switching device 10 turns to the off state upon application of the feedback controlled turn-off voltage G (FIG. 13($b$)). It can be judged that the solid electrolyte switching device 10 maintains the off state by the fact that output voltage is maintained at 50 mV while the positive voltage E1 of 50 mV amplitude is input after the turn-off voltage G. In this case most of the input voltage E1 is applied to the solid electrolyte switching device.

Turn-on and turn-off are alternately repeated about seven times in FIG. 13, and it can be seen that the solid electrolyte switching device 10 operates normally for turn-on and turn-off. Although not shown in the figure, the device failure by long time repetition of turn-on and turn-off, that is, the error occurrence frequency was studied, but the error was totally prevented by the feedback control.

Here, one feedback control, that is, the time required for sequence was about 100 ms. If the feedback circuit is made of an exclusive electric circuit or the solid electrolyte switching device and the feedback circuit are integrated together, then the time for one sequence can be shortened below 100 ns. Accordingly, the solid electrolyte switching device of the present invention can be conducted accurately the transition between on and off states and the control of the on resistance by applying the feedback controlled input voltage.

Thus, using a solid electrolyte switching device 10 of the present invention, re-writing of the on and off states is possible, and the on or off state can be maintained if the power source is shut off. The resistance of the on state can be made lower than that of MOS type memory of similar size. As mentioned above, ion deficient layer or the disappearance state of metal filament 18 corresponds to the void required for electronic cells of the thirdly existing example, and so the void is no longer needed.

Since the solid electrolyte switching device of the present invention has simple structure, and is operated, in principle, by the size of atomic order, by far the higher integration is possible than existing electric cells, in addition the fabrication of the device is relatively simple.

Next, the fifth embodiment with regard to FPGA using a solid electrolyte switching device of the present invention is shown.

Figure 14:
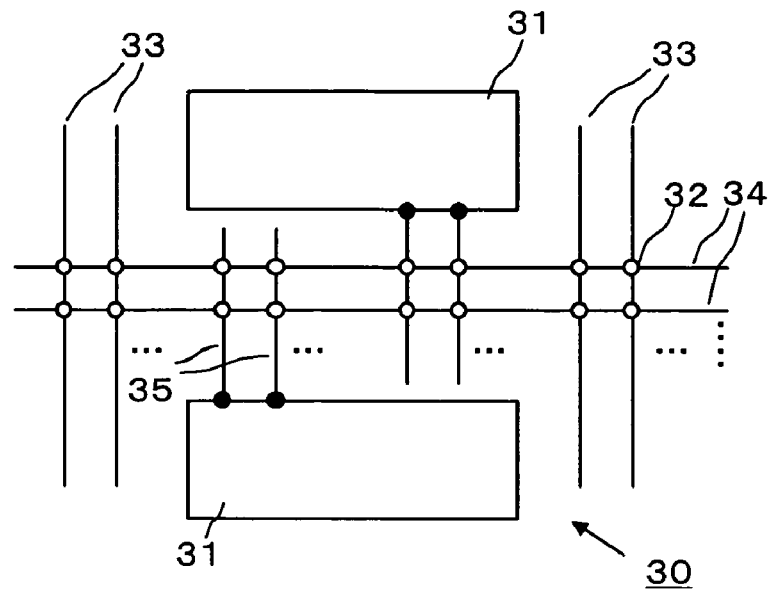
FIG. 14 is a block diagram of FPGA using a solid electrolyte switching device of the fifth embodiment.

FIG. 14 shows an outline of an FPGA 30 using a solid electrolyte switching device of the fifth embodiment of the present invention. FPGA 30 consists of, as basic units, a logic circuit block 31, interconnections 33-35 in the logic circuit block 31, and a solid electrolyte switching device 32 of the present invention that switches the connection of interconnections. Further, FPGA 30 is constituted by the plurality of logic circuit blocks 31, the interconnections 33-35 in the plurality of logic circuit blocks 31, and the solid electrolyte switching device 32 of the present invention which switches the connection of the plurality of interconnections.

On the substrate 11 on which the logic circuit block 31 and peripheral circuits are integrated, the solid electrolyte switching device 32 described in either one of the first to the fourth embodiments and interconnections 33-35 are formed. The vertical interconnections (33, 35) and the horizontal interconnections (34) which are connected to the solid electrolyte switching device 32 correspond, respectively, to the first interconnection layer 13 and the second interconnection layer 14 shown in either one of FIG. 1-FIG. 4, or the second interconnection layer 14 and the first interconnection layer 13. FPGA of desired function is manufactured by selecting the first and the second interconnection layers, and setting the desired solid electrolyte switching device to the on or off states.

Since the solid electrolyte switching device 32 of the present invention can be switched reversibly from the off to the on state, or from the on to the off state by applying a threshold voltage between the first interconnection layer 13 and the second interconnection layer 14, the FPGA of the present invention is the re-writable FPGA. The reproducibility is also sufficient, and the FPGA of the present invention is capable of programming of 106 times. Further, since the on resistance of the solid electrolyte switching device 32 of the present invention is low, FPGA of small propagation delay is possible.

Next, the sixth embodiment with regard to a memory device using a solid electrolyte switching device of the present invention is shown.

Figure 15:
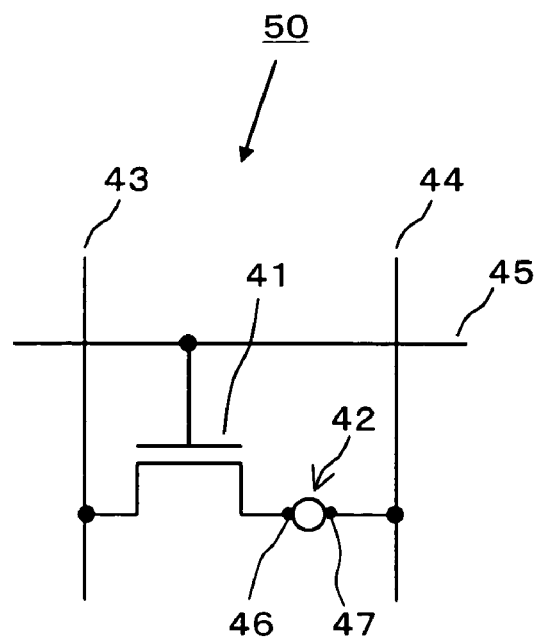
FIG. 15 is a circuit diagram of a memory cell using a solid electrolyte switching device of the sixth embodiment and a MOS transistor.

FIG. 15 is a diagram of a memory device using a solid electrolyte switching device of the sixth embodiment of the present invention. In this figure, a memory device 50 using a solid electrolyte switching device of the present invention is constituted by a MOS transistor 41 for cell selection, a solid electrolyte switching device 42, a bit line 43, a ground line 44, and a word line 45. The first interconnection layer 46 as one end of the solid electrolyte switching device 42 is connected to a drain of the MOS transistor 41, and the second interconnection layer 47 as the other end of the solid electrolyte switching device 42 is connected to the ground line 44. Needless to mention, these first and second interconnection layers may be changed.

In case to program the memory device 50 using a solid electrolyte switching device, the MOS transistor 41 is set to select the bit line 45 and the ground line 44 in the on state by applying a voltage to the word line 45. And then, a threshold voltage is applied to the solid electrolyte switching device 42 by applying the voltage between bit line 43 and the ground line 44. The threshold voltage is about +0.07V and −0.28V in the example of FIG. 5 described above. For example, the solid electrolyte switching device 42 is set in the off state by applying a voltage of +0.07V higher than the on voltage of MOS transistor between the bit line 43 and the ground line 44, and the off state is memorized. The solid electrolyte switching device 42 is set in the on state by applying a voltage lower than −0.28V to the solid electrolyte switching device 42 between the bit line 43 and the ground line 44, and the on state is memorized.

In order to read out the memorized data in the memory device 50 using the solid electrolyte switching device, MOS transistor 41 is set in the on state by applying a voltage to the word line 45, and then a resistance between the bit line 43 and the ground line 44 is detected. The resistance is high if the solid electrolyte switching device 42 is in the off state, and low if it is in the on state. Thus, the stored data in the memory device 50 using the solid electrolyte switching device can be read out. Since the stored data of the solid electrolyte switching device is retained even if the voltage of the power source is disconnected, the memory device 50 using the solid electrolyte switching device 42 of the present invention can be used as a non-volatile memory device.

Next, the seventh embodiment of a manufacturing method of a solid electrolyte switching device of the present invention is explained with reference to FIG. 16.

Figure 16:
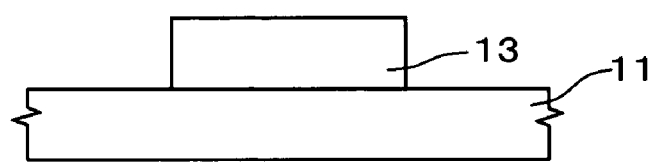
FIG. 16 is a cross-sectional view showing, in order, the manufacturing process of a solid electrolyte switching device of the seventh embodiment.
Figure 16:
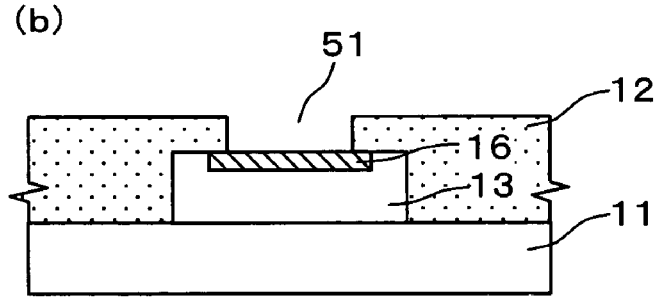
Figure 16:
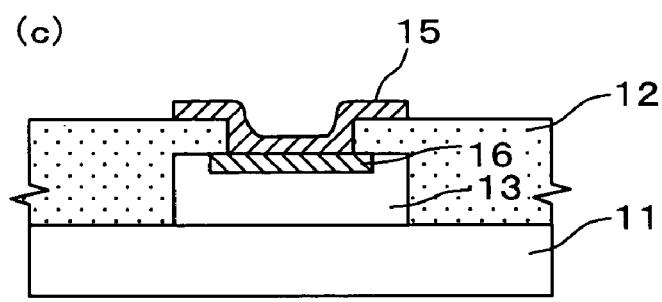
Figure 16:
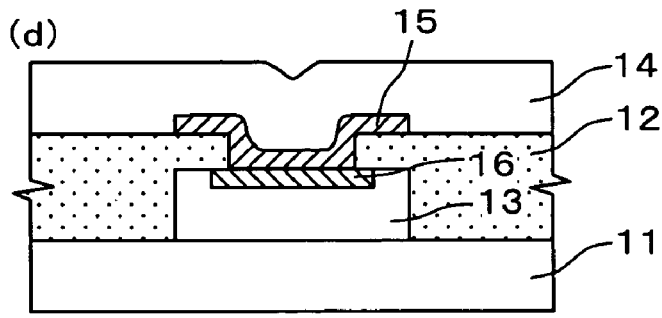

FIG. 16 shows, in order, a manufacturing process of the solid electrolyte switching device with respect to the first embodiment mentioned above, and does so using a cross-sectional illustration of the device. As shown in FIG. 16(a), a substrate 11 is manufactured first by oxidizing a silicon substrate, and then a copper thin film of 200 nm thickness is formed on the substrate 11 by a vacuum evaporation or a sputtering method.

Next, by using a resist mask with an open window except for a region of the first interconnection layer 13, a shape of the first interconnection layer 13 is formed by an etching the excess copper thin film outside of the first interconnection layer 13 by a wet etching method or a reactive ion etching method.

Next, as is shown in FIG. 16(b), an interlevel insulating layer 12 is formed. For example, a silicon oxy-nitride film (SiON) is formed by the sputtering method as the interlevel insulating layer 12. After the formation of the interlevel insulating layer 12, a via hole 51 is formed by the dry or wet etching with the resist pattern mask opened in the via le 51 region.

Here, the material of the interlevel insulating layer 12 is preferably a low-k (dielectric constant) dielectric film to shorten propagation delay time and to reduce the parasitic capacitance. The material of the interlevel insulating layer 12, may be either one of $SiO_2$ film, an insulating polymer material, or silicon oxy-nitride film. The insulating polymer material may be chloromethylated calixarene (p-chloromethoxy calyx[6]arene) or else can be preferably used. Also, the formation of the interlevel insulating layer 12 is preferably a low temperature process. The thickness of this interlevel insulating layer 12 may be 50-500 nm.

Next, copper exposed on via hole 51 is sulphidized. The sulphidizing copper is conducted by an anodic polarization in the aqueous solution containing sulfide. The anodic polarization is conducted with copper thin film as a cathode in the aqueous solution containing 0.05 mole/liter of sodium sulfide. The applied voltage is about 0.5V or so, and the sulphidit is adjusted by controlling ion current. Sulphidizing is stopped when the copper thin film surface layer has been sulphidized to the desired thickness. For example, the reaction is stopped when the copper thin film surface layer is sulphidized to 2 to 20 nm. The copper sulfide part thus sulphidized becomes the solid electrolyte layer 16, and the copper part left over not sulphidized becomes the first interconnection layer 13. During this sulphidizing here, since the sulfidit can be controlled by measurement of the conductivity of copper thin film, the copper thin film can be formed with sulfide film thickness being controlled. In the present example, since copper that is the constituting metal of solid electrolyte is used as the material of the first interconnection layer 13, the forming of an ion supplying layer 17 can be omitted.

Here the thickness of the solid electrolyte layer 16 may be about 2 to 200 nm in case of copper sulfide that is mixed conductive material. The film thickness when copper is used for the first interconnection layer 13 may be about 20 to 300 nm. If the first interconnection layer 13 is anything other than copper, then the ion supplying layer 17 may be of copper as a material and its film thickness may be about 2 to 50 nm. The second interconnection layer 14 may be of copper, and its film thickness may be about 20 to 300 nm.

Next, as shown in FIG. 16(c), a counter electrode layer 15 is formed with titanium. In the present example titanium was deposited by the vacuum evaporation method. The thickness of the counter electrode layer 15 was 5 to 30 nm.

Finally, as shown in FIG. 16(d), copper that is going to be the second interconnection layer is deposited onto the interlevel insulating layer 12 by the sputtering method. Next, by using a resist mask with an open window outside of the region of the second interconnection layer 14, the second interconnection layer 14 is formed by the dry etching method. In the present example copper film of thickness about 20 to 300 nm is used for the second interconnection layer 14. Besides copper as mentioned above, the first interconnection layer 13 and the second interconnection layer 14 may be of any conventional interconnection materials such as, for example, aluminum, gold, and platinum.

The solid electrolyte switching device of the present invention can thus be fabricated, and copper sulfide which is mixed conductive material is preferred as the solid electrolyte layer 16. Copper sulfide changes from cupric sulfide to stable cuprous sulfide at 220° C. The melting point of cuprous sulfide is 1130° C. and so its thermal stability is good. It is confirmed by the present inventors that the characteristic change is not observed by one hour of heating at 300° C.

Next, the eighth embodiment of the manufacturing method of a solid electrolyte switching device of the present invention is explained with reference to FIG. 17.

Figure 17:
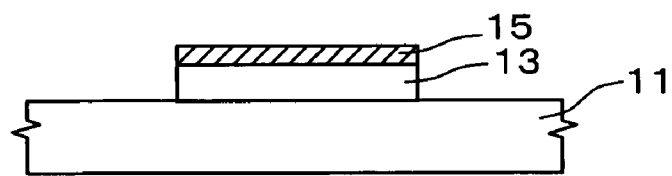
FIG. 17 is a cross-sectional view showing in order the manufacturing process of a solid electrolyte switching device of the eighth embodiment.
Figure 17:
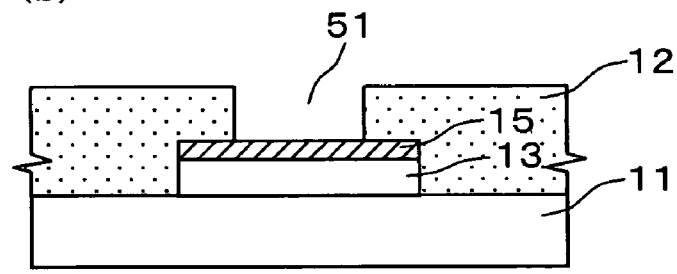
Figure 17:
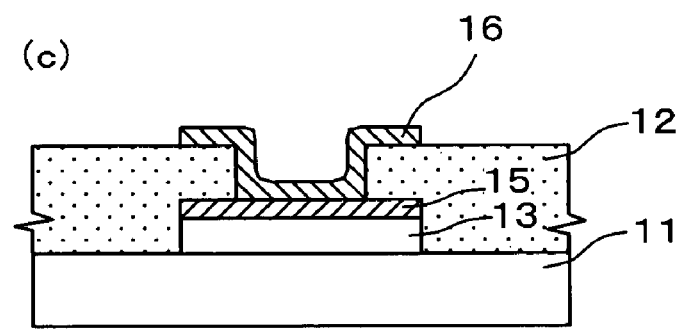
Figure 17:
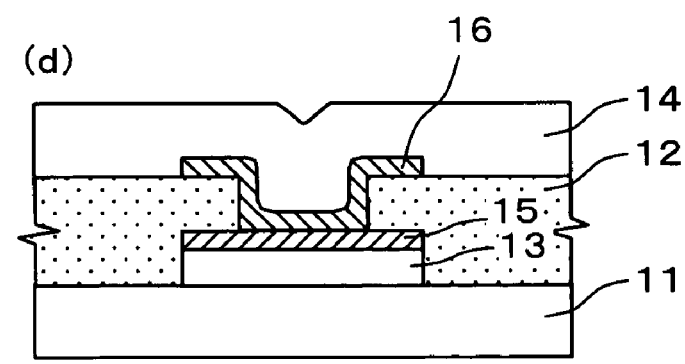
Figure 18:
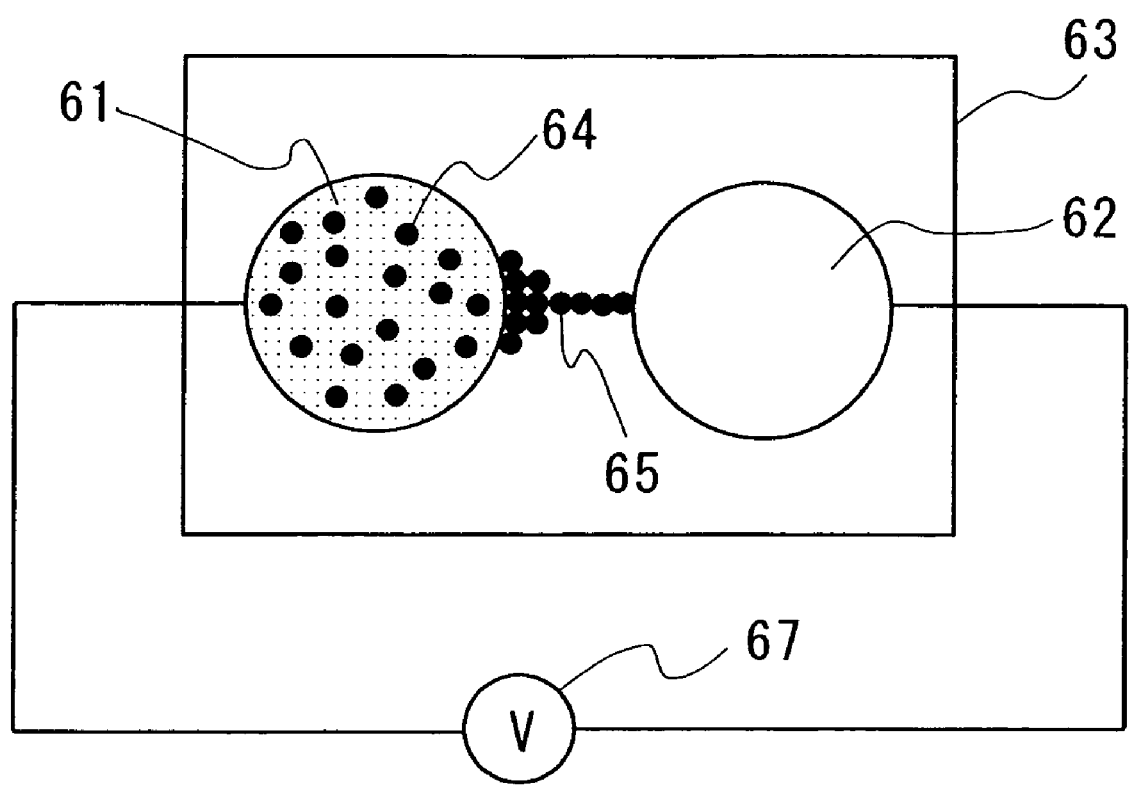
FIG. 18 is the outline of structure of an electronic cell as the third prior art.
Figure 19:
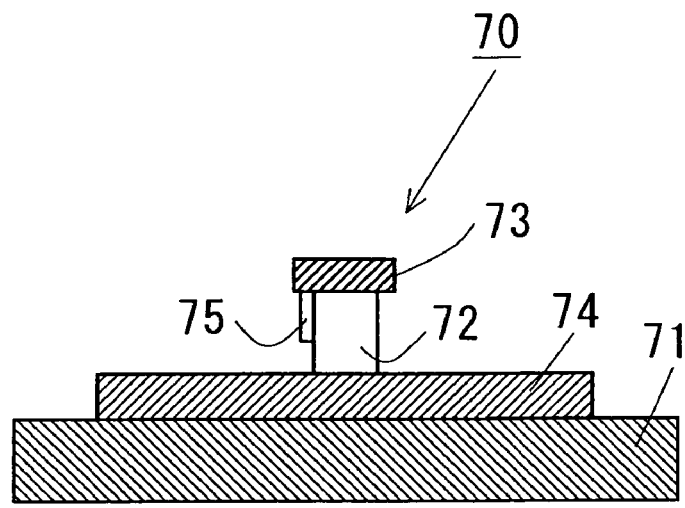
FIG. 19 is a cross-sectional view of structure of an electronic cell as the fourth prior art.
Figure 20:
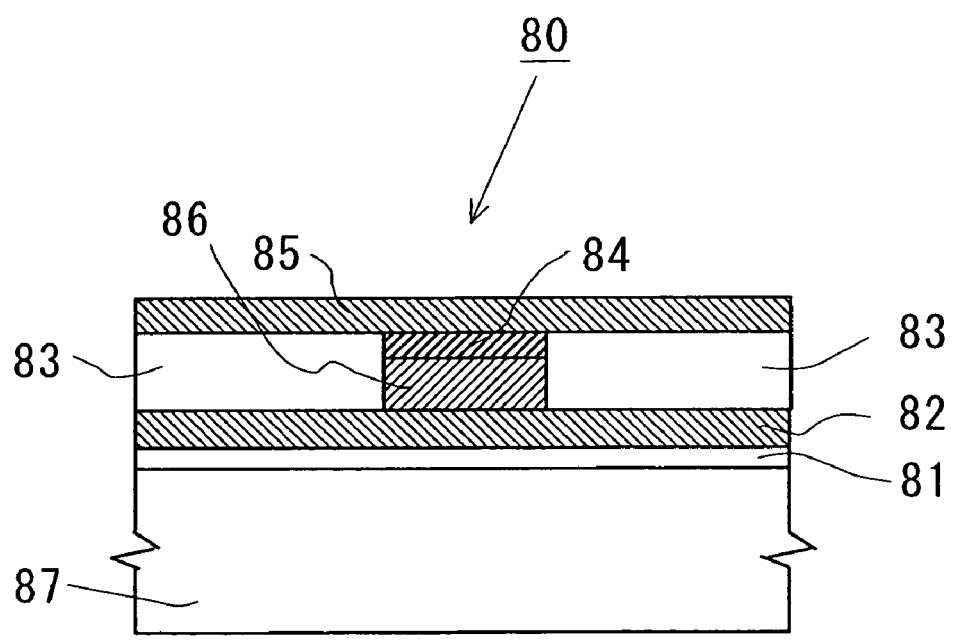
FIG. 20 is a cross-sectional view of structure of an electronic cell as the fifth prior art.

FIG. 17 shows in order the manufacturing process of a solid electrolyte switching device 20 with respect to the third embodiment described above, and does so using a cross-sectional illustration of the device. As is shown in FIG. 17(a), a substrate 11 is manufactured first by oxidizing a silicon substrate, and then copper thin film of 200 nm thickness is formed as the first interconnection layer 13 on the substrate 11 by the vacuum evaporation or sputtering method. Next, a counter electrode layer 15 is formed with titanium by the vacuum evaporation method. Copper thin film and titanium are etched to the shape of a first interconnection layer 13 through a resist pattern mask with an open window except for the region of the first interconnection layer 13 by using either wet etching or reactive ion etching method.

Next, as shown in FIG. 17(b), a silicon oxy-nitride film is formed by the sputtering method to form an interlevel insulating layer 12. After the formation of the silicon oxy-nitride film, a via hole 51 is formed by the dry or wet etching with the resist pattern mask opened in the via hole region 51.

Next, as shown in FIG. 17(c), a solid electrolyte layer 16 is formed. Copper thin film of 200 nm thickness is formed first by the vacuum evaporation or sputtering method. Following this, the copper thin film is completely sulphidized by anodic polarization in the aqueous solution containing sulfide. Further, by using a resist mask with an open window except for the region of a solid electrolyte layer 16, the solid electrolyte layer 16 is formed by etching unnecessary copper using reactive ion etching method.

Finally, as shown in FIG. 17(d), copper is deposited by the sputtering method, and the second interconnection layer 14 is formed by etching copper outside of the second interconnection layer. Etching is performed by the reactive ion etching method with a resist mask that has an opening window outside of the region of the second interconnection layer 14. Since the first interconnection layer 14 is made of copper, formation of an ion supplying layer 17 was omitted.

Here, the performances of a solid electrolyte switching device of the present invention shown in FIG. 5 and FIG. 6 have a tendency that the initial conductivity of the solid electrolyte switching device is determined by the film thickness of the solid electrolyte layer 16 which was explained in the manufacturing method of the solid electrolyte switching device of the present invention with regard to the seventh and eighth embodiments described above. If the solid electrolyte layer 16 is thick, then the initial conductivity of the solid electrolyte switching device is low and it tends to be in the off state. On the other hand, if the solid electrolyte layer 16 is thin, then the initial conductivity of the solid electrolyte switching device is high and it tends to be in the on state like the characteristics of the solid electrolyte switching device of the present invention shown in FIG. 6.

The details of film thickness in relation to the initial state of the solid electrolyte switching device of the present invention being off or on state, and the surface condition of the solid electrolyte layer 16 at that time have been studied, but the details have so far not been clarified.

The sulphidizing, to obtain copper sulfide by sulphidizing copper, explained in the manufacturing method of the solid electrolyte switching device of the present invention in the seventh and eighth embodiments described above, can be conducted by the following methods besides anodic polarization method. The second sulphidizing method is putting the substrate 11 with copper thin film formed on it into a crucible together with sulfur powder, and heating a baking furnace up to 130° C. in nitrogen atmosphere. Here the sulfidit can be known by measuring the conductivity of copper thin film during sulphidizing, and so the sulfidit of copper thin film can be well controlled. The sulphidizing is to be halted when the surface layer of copper thin film is sulphidized to the predetermined thickness.

The third sulphidizing method is heating a substrate at 120 to 130° C. in the atmosphere of hydrogen disulfide diluted with nitrogen. In this case, too, the sulfidit can be well controlled by measuring the resistance of the thin copper film.

Copper sulfide may be formed, not by sulphidizing thin copper film, but by such techniques as deposition of copper sulfide using sputtering or laser ablation method.

In the seventh embodiment, if copper sulfide is deposited by the sputtering or laser ablation method, copper sulfide is deposited and processed after the first interconnection layer 13 is formed, and before an interlevel insulating layer 12 is formed.

Here, the combinations of metal sulfide to form a solid electrolyte layer 16 and an ion supplying layer 17 may be, besides the copper sulfide and copper mentioned above, chromium sulfide and chromium, silver sulfide and silver, titanium sulfide and titanium, tungsten sulfide and tungsten, nickel sulfide and nickel, and tantalum sulfide and tantalum.

A solid electrolyte layer 16 may also be, as the material other than the metal sulfides described above, either one of molybdenum sulfide, zinc sulfide, germanium-antimony-tellurium compound, or arsenic-tellurium-germanium-silicon compound. And for the ion supplying layer 17 silver can be used besides copper.

As for the combination of the solid electrolyte layer 16 and the ion supplying layer, the I-V characteristics similar to FIG. 5 and FIG. 6 were observed for the combinations molybdenum sulfide and copper and germanium-antimony-tellurium compound and silver, respectively.

Thus, by the manufacturing method of the solid electrolyte switching device of the seventh and eighth embodiments of the present invention, the solid electrolyte switching device can be manufactured with high accuracy and reproducibility by using such well-known fabrication technologies of integrated circuits as metal film deposition, sulphidizing, metal etching, or oxide or nitride film deposition and their etching. Hence the solid electrolyte switching device can be easily fabricated with low cost.

The on voltage at which the solid electrolyte switching device turns from the off to on state, and the off voltage at which the solid electrolyte device turns from the on to off state, that is, the threshold voltage, can be controlled by adjusting the voltage applied between the solid electrolyte layer and the counter electrode layer upon manufacturing. In case of the example shown in FIG. 5, assume that the voltage applied between the second interconnection layer 14 and the first interconnection layer 13 is expressed as positive for the second interconnection layer 14 side. After applying a voltage of −1V which is the negative threshold voltage for 10 seconds, then the threshold voltage is changed to −0.4V for transition from the off to on state. With higher applied voltage, further higher threshold voltage can be obtained. In case of the example shown in FIG. 6, the threshold voltage is ±0.6V by ±1V of the applied voltage. Further with higher applied voltage, higher threshold voltage can be obtained.

The present invention is by no way limited to the embodiments described above, but various modifications are possible within the range of invention set forth in the claims, and needless to say that these are also included in the range of the present invention. In the embodiment described above, for example, the case in which silicon is used as substrate was explained, but substrates are not limited by this, and of course compound semiconductors and others are also applicable.

Industrial Applicability

As will have been appreciated from the foregoing description, the present invention provides switching devices which can set on or off state at will by applying the predetermined voltage, which are non-volatile, and which have low resistance in the on state. Further since the switching devices of the present invention are simple and fine structured, they are capable of bringing about a far finer structure than are the switching devices of the present state of the art.

Further, by using the switching devices of the present invention as the switching devices for FPGA, re-programmable FPGA of high operation speed can be provided.

Further, by using the switching devices of the present invention as a memory cell of memory devices, non-volatile memory device of high programming and reading speed can be provided. Further since the switching devices of the present invention are simple and fine structured, the memory integrated circuits of high integration and high speed can be provided.

Further, by a manufacturing method of the present invention, production can be of high accuracy and reproducibility by applying prior integrated circuits technologies, and hence the solid electrolyte switching device, and such integrated circuits as FPGA, memory, and so forth using them can be provided at low cost.

What is claimed is:

1. A solid electrolyte switching device, comprising:
a substrate in which a surface is coated with an insulation layer;
a first interconnection layer set on said substrate;
an ion supplying layer set on said first interconnection layer;
a solid electrolyte layer set on said ion supplying layer;
an interlevel insulating layer having a via hole set to cover said first interconnection layer, said ion supplying layer, and said solid electrolyte layer;
a counter electrode layer set to contact said solid electrolyte layer through said via hole of said interlevel insulating layer; and
a second interconnection layer set to cover said counter electrode layer,
wherein said first interconnection layer is formed with the same material as that of said ion supplying layer,
said via hole is confined in area so that said interlevel insulating layer contacts an outer periphery of a top surface of said solid electrolyte layer and said counter electrode layer contacts an area inside of the outer periphery of the top surface of said solid electrolyte layer, and
said solid electrolyte layer is any one of chromium sulfide, titanium sulfide, tungsten sulfide, nickel sulfide, tantalum sulfide, molybdenum sulfide, germanium-antimony-tellurium compound, and arsenic-tellurium-germanium-silicon compound.

2. A solid electrolyte switching device, comprising:
a substrate in which a surface is coated with an insulation layer;
a first interconnection layer set on said substrate;
an ion supplying layer set on said first interconnection layer;
a solid electrolyte layer set on said ion supplying layer;
an interlevel insulating layer having a via hole set to cover said first interconnection layer, said ion supplying layer, and said solid electrolyte layer;
a counter electrode layer set to contact with an outer region of said solid electrolyte layer through said via hole of said interlevel insulating layer; and
a second interconnection layer set to cover said counter electrode layer,
wherein said interlevel insulating layer is sandwiched between said substrate and said second interconnection layer and is in contact with each of said counter electrode layer, said first interconnection layer, said ion supplying layer, and said solid electrolyte layer, said via hole is confined in area so that said interlevel insulating layer contacts an outer periphery of a top surface of said solid electrolyte layer and said counter electrode layer contacts an area inside of the outer periphery of the top surface of said solid electrolyte layer, and said solid electrolyte layer is any one of chromium sulfide, titanium sulfide, tungsten sulfide, nickel sulfide, tantalum sulfide, molybdenum sulfide, germanium-antimony-tellurium compound, and arsenic-tellurium-germanium-silicon compound.

3. The solid electrolyte switching device as set forth in claim 1 or claim 2, characterized in that said solid electrolyte layer consists of an ion conductive material, and said ion supplying layer consists of the material which supplies ions to said ion conductive material.

4. The solid electrolyte switching device as set forth in claim 1 or claim 2, characterized in that said ion supplying layer is copper.

5. The solid electrolyte switching device as set forth in claim 1 or claim 2, characterized in that said solid electrolyte layer consists of the mixed conductive material in which ion conduction and electron conduction co-exist, and said ion supplying layer consists of the material which supplies ions to said mixed conductive material.

6. The solid electrolyte switching device as set forth in claim 1 or claim 2, characterized in that the combination of said solid electrolyte layer and said ion supplying layer is any one combination of chromium sulfide and chromium, titanium sulfide and titanium, tungsten sulfide and tungsten, nickel sulfide and nickel, and tantalum sulfide and tantalum.

7. The solid electrolyte switching device as set forth in claim 1 or claim 2, characterized in that said counter electrode layer is any one of platinum, aluminum, copper, titanium, tungsten, vanadium, niobium, tantalum, chromium, molybdenum, and the nitride or silicide of these metals, or the combination thereof.

8. The solid electrolyte switching device as set forth in claim 1 or claim 2, characterized in that, said solid electrolyte switching device has off characteristics in the initial state before voltage application.

9. The solid electrolyte switching device as set forth in claim 1 or claim 2, characterized in that said solid electrolyte switching device has on characteristics in the initial state before voltage application.

10. FPGA which uses a solid electrolyte switching device, characterized in that the solid electrolyte switching device as set forth in claim 1 is used as a switching device for programming of FPGA.

11. A memory device which uses a solid electrolyte switching device, characterized in that said memory device has the solid electrolyte switching device as set forth in claim 1, and a MOS transistor, and said first or second interconnection layer of said solid electrolyte switching device is connected to the drain or source of said MOS transistor.

12. A memory device which uses a solid electrolyte switching device, characterized in that said memory cell has the solid electrolyte switching device as set forth in claim 1, and a MOS transistor, and the first interconnection layer of said solid electrolyte switching device is connected to the drain of said MOS transistor, and the second interconnection layer of said solid electrolyte switching device is connected to a ground line, and the source of said MOS transistor is made an address line, and the gate of said MOS transistor is made a word line.

13. The solid electrolyte switching device as set forth in claim 1, wherein said interlevel insulating layer is sandwiched between said substrate and said second interconnection layer and is in contact with each of said counter electrode layer, said first interconnection layer, said ion supplying layer, and said solid electrolyte layer.

14. The solid electrolyte switching device as set forth in claim 1, wherein a current voltage characteristic of said solid electrolyte switching device is caused by a current path formed inside said solid electrolyte layer.

15. The solid electrolyte switching device as set forth in claim 1, wherein said ion supplying layer is of copper and said counter electrode layer is of titanium, and wherein a current voltage characteristic of said solid electrolyte switching device is caused by a current path formed inside said solid electrolyte layer.

16. The solid electrolyte switching device as set forth in claim 2, wherein a current voltage characteristic of said solid electrolyte switching device is caused by a current path formed inside said solid electrolyte layer.

17. The solid electrolyte switching device as set forth in claim 2, wherein said ion supplying layer is of copper and said counter electrode layer is of titanium, and wherein a current voltage characteristic of said solid electrolyte switching device is caused by a current path formed inside said solid electrolyte layer.

* * * * *